United States Patent [19]
Mandl

[11] Patent Number: 5,659,315
[45] Date of Patent: *Aug. 19, 1997

[54] METHOD AND APPARATUS FOR MULTIPLEXED OVERSAMPLED ANALOG TO DIGITAL MODULATION

[76] Inventor: William J. Mandl, 8303 Faust St., West Hills, Calif. 91304

[*] Notice: The term of this patent shall not extend beyond the expiration date of Pat. No. 5,515,046.

[21] Appl. No.: 480,130

[22] Filed: Jun. 7, 1995

Related U.S. Application Data

[63] Continuation-in-part of Ser. No. 211,047, Aug. 4, 1994, Pat. No. 5,515,046, which is a continuation-in-part of Ser. No. 885,474, May 19, 1992, Pat. No. 5,248,971.

[51] Int. Cl.$^6$ .................................................. H03M 3/00
[52] U.S. Cl. .................. 341/143; 341/141; 341/162; 341/172
[58] Field of Search .................................. 341/141, 143, 341/162, 163, 164, 165, 166, 157, 172

[56] References Cited

U.S. PATENT DOCUMENTS

| | | | |
|---|---|---|---|
| 4,353,057 | 10/1982 | Bernet et al. | 341/172 |
| 4,704,600 | 11/1987 | Uchimura et al. | 341/143 |
| 5,014,059 | 5/1991 | Seckora | 341/172 |
| 5,030,953 | 7/1991 | Chiang | 341/172 |
| 5,075,679 | 12/1991 | Gazsi | 341/143 |
| 5,140,325 | 8/1992 | Yu et al. | 341/143 |
| 5,142,286 | 8/1992 | Ribner et al. | 341/143 |
| 5,150,120 | 9/1992 | Yunus | 341/143 |

*Primary Examiner*—Howard L. Williams
*Attorney, Agent, or Firm*—Freilich, Hornbaker & Rosen

[57] ABSTRACT

Apparatus for time multiplexed oversampled analog to digital modulation is provided. Embodiments generally include a plurality of energy collection elements coupled to individual pixel processors preferably mounted proximate to each energy collection element. Each pixel processor shares a common block of conversion logic to form a plurality of integration loops to process the signal generated by each energy collection element. Specific embodiments are shown using CCD, CID, FET, and charge well technologies.

24 Claims, 21 Drawing Sheets

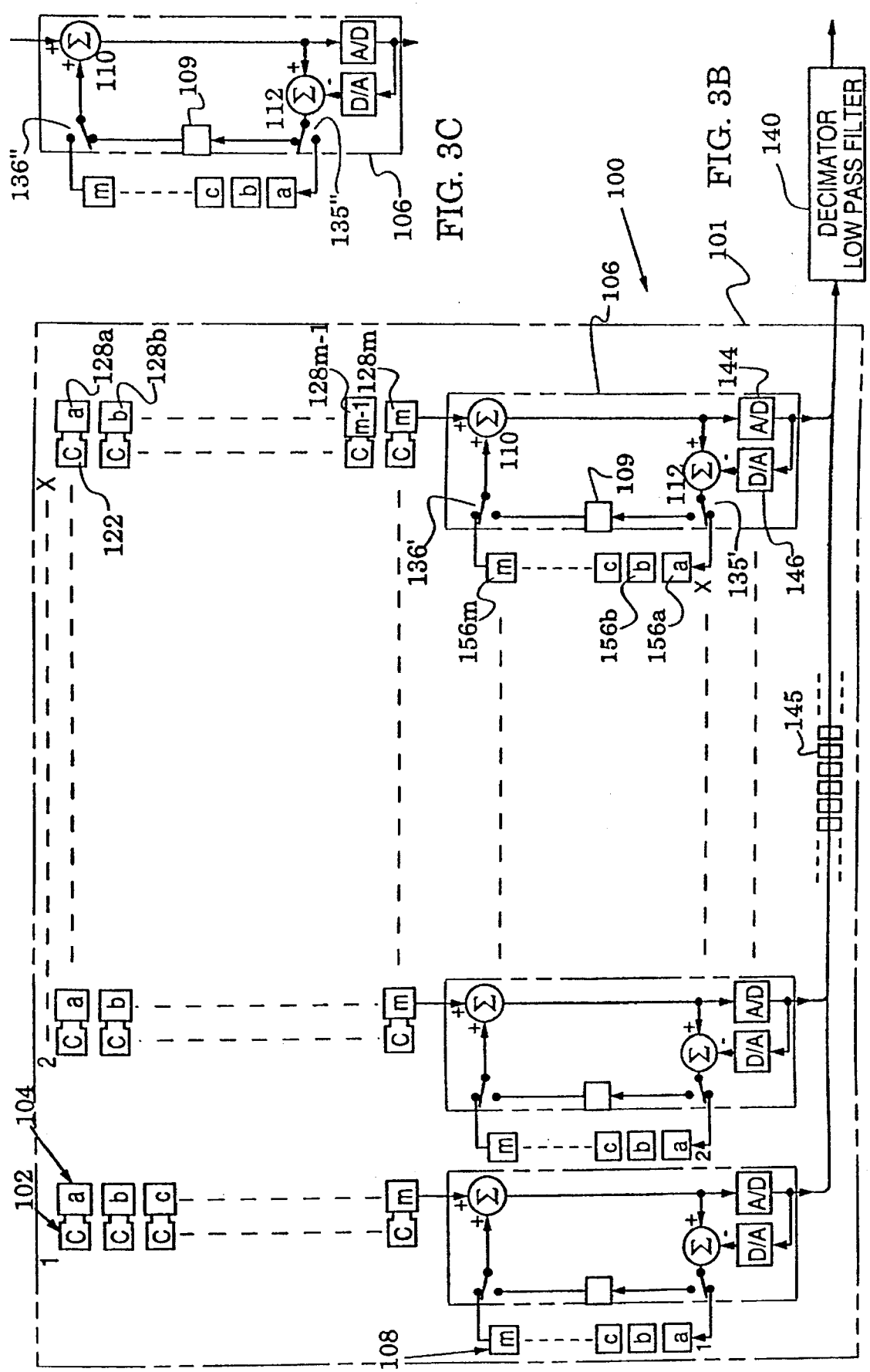

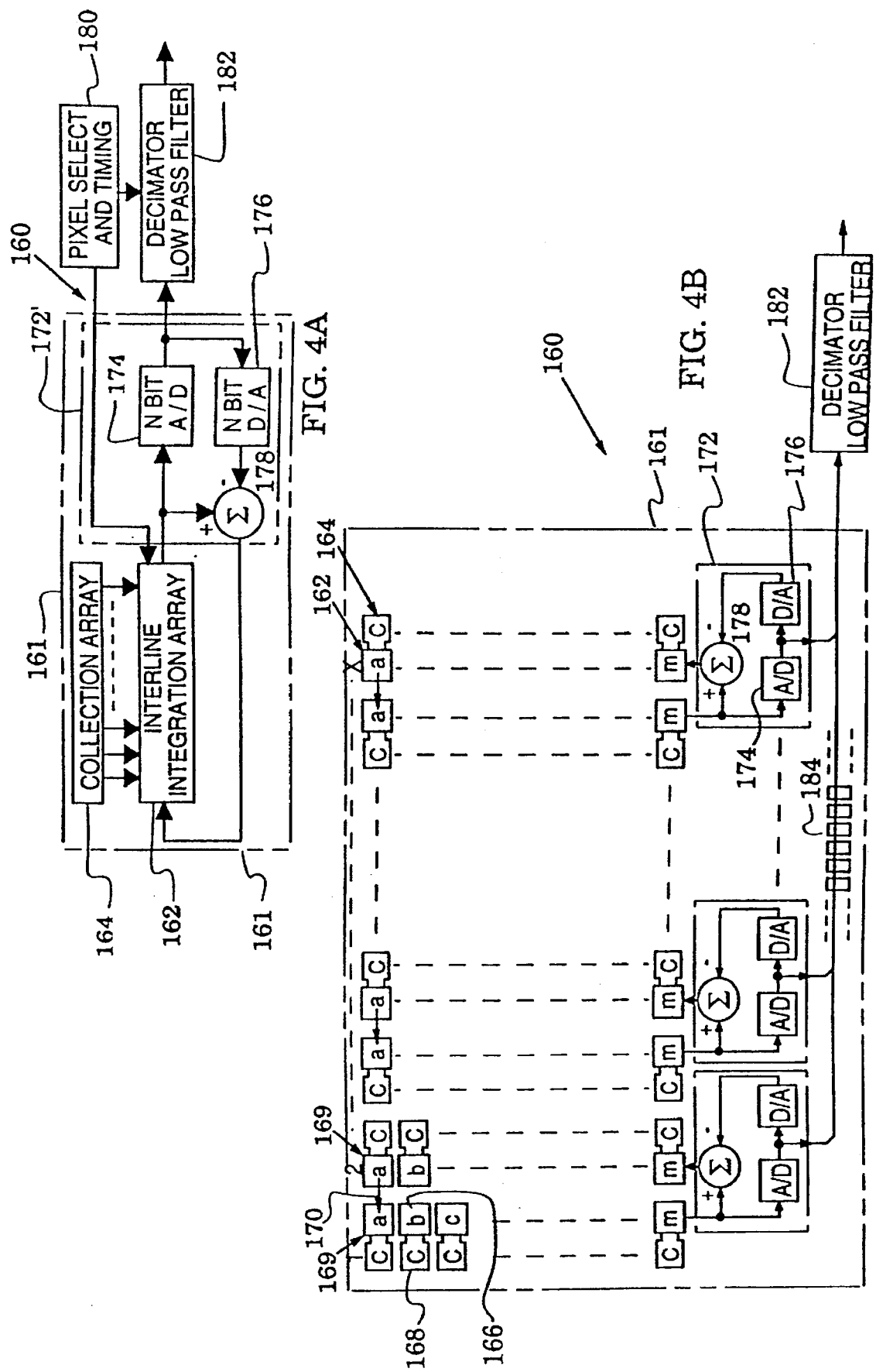

METHOD AND APPARATUS FOR MULTIPLEXED OVERSAMPLED ANALOG TO DIGITAL MODULATION

This application is a continuation in part of application Ser. No. 08/211,047, filed Aug. 4, 1994, now U.S. Pat. No. 5,515,046 turn is a continuation in part of application Ser. No. 07/885,474, filed May 19, 1992, now U.S. Pat. No. 5,248,971.

FIELD OF THE INVENTION

The present invention relates generally to analog to digital (A/D) conversion and more particularly to a multiplexed oversampled analog to digital modulator suitable for processing an array of analog inputs, as for example, in a optical imager, to produce a digital output.

BACKGROUND OF THE INVENTION

Present approaches in focal-plane video imaging systems use some form of analog multiplexing of the pixel data in order to read the image information. It is this multiplexing which defines the so called video data rates. In broadcast television, for example, the 30 hertz pixel data rate is multiplexed to the 4 megahertz video data rate. This same situation exists in industrial and military video systems where pixel rates are usually below 3 kilohertz and analog multiplexing is used with resulting megahertz video rates.

These multiplexing approaches have necessitated the use of analog to digital conversion processes employing high speed circuitry which, as a practical matter cannot be readily integrated with a focal-plane sensor. Moreover, the typical A/D converter in these applications comprises a high-speed video, flash converter which is generally considered too expensive for use in consumer applications.

As is discussed in Oversampling Delta-Sigma Data Converters, edited by James C. Candy and Gabor C. Temes, IEEE Press, 1992, New York, oversampled analog to digital (A/D) converters are known which use coarse quantization at a high sampling rate combined with negative feedback and digital filtering to achieve increased resolution at a lower sampling rate.

Such converters may, therefore, exploit the speed and density advantages of modern very large scale integration (VLSI) while at the same time reducing the requirements for component accuracy.

In a type of oversampled A/D converter generally known as a delta-sigma modulator, the analog input is sampled at a rate well above the Nyquist frequency and fed to a quantizer via an integrator. The quantized output is fed back and subtracted from the input. This feedback forces the average value of the quantized output to track the average analog input value.

SUMMARY OF THE INVENTION

The present invention is directed to low cost analog to digital (A/D) conversion apparatus suitable for processing an array of analog inputs derived from an energy imager, such as an optical imager used in video cameras. Embodiments corresponding to FIGS. 1–7 are first disclosed in the parent application Ser. No. 07/885,474. Additional embodiments are disclosed corresponding to FIGS. 8–11B in the continuation in part Ser. No. 08/211,047. FIGS. 12A–18 correspond to new embodiments disclosed in this application.

More specifically, the invention is directed to such A/D conversion apparatus which is capable of being located on or adjacent to the focal-plane sensor of an optical imager and which is characterized by the use of a time multiplexed oversampled conversion technique.

In accordance with a preferred embodiment, an array of energy collection elements generate analog signals which are sampled by an oversampled A/D modulator which produces, for each input, a single-bit output that oscillates about the true value of the input at rates well above the Nyquist rate (the Nyquist rate being twice the highest signal frequency of interest). A plurality of pixel processors, preferably mounted proximate to each energy collection element, periodically share a common block of conversion logic to form a plurality of feedback loops. Consequently, the common block of conversion logic thus produces at its output, a single bit stream which is representative of all of the energy collection elements.

In accordance with a preferred embodiment, an imager is comprised of 1) m energy collection elements, each capable of producing an analog pixel signal related to the amount of energy incident thereon, said m energy collection elements being mounted for respectively collecting energy from different areas of said focal plane, 2) m integrators each for integrating a different one of said pixel signals, 3) a common comparator for generating a one-bit comparison signal periodically related to each of said m integrated pixel signals and indicative of whether each of said integrated pixel signals exceed a predetermined threshold value, 4) timing circuitry for periodically sampling said one-bit comparison signal, 5) charge removal circuitry for periodically removing charge from each of said analog pixel signals according to the sample of said one-bit comparison signal related thereto, 6) a single N-bit A/D converter for periodically generating an N-bit value associated with each of said integrated pixel signals, and 7) a decimator for processing a plurality of said N-bit values associated with each of said analog pixel signals to generate said bit stream output.

In an alternative embodiment, the single comparator is replaced with a single N-bit A/D converter and the most significant bit of this converter is used as the comparison signal.

In accordance with a further system embodiment, the integration function associated with the oversampled modulation and the analog storage elements for storing each analog residue are realized with an array of integration elements (e.g., CCDs, CIDs, FETs, charge wells) arranged in close physical relationship with the light sensitive array.

The novel features of the invention are set forth with particularity in the appended claims. The invention will be best understood from the following description when read in conjunction with the accompanying drawings.

BRIEF DESCRIPTION OF THE DRAWINGS

FIG. 3B is a schematic diagram of the imager of FIG. 3A;

FIG. 3C illustrates an alternate position of the switches of FIG. 3B;

FIG. 4A is a block diagram of another preferred optical imager embodiment;

FIG. 4B is a schematic diagram of the imager of FIG. 4A;

DESCRIPTION OF THE PREFERRED EMBODIMENTS

Figure 1:
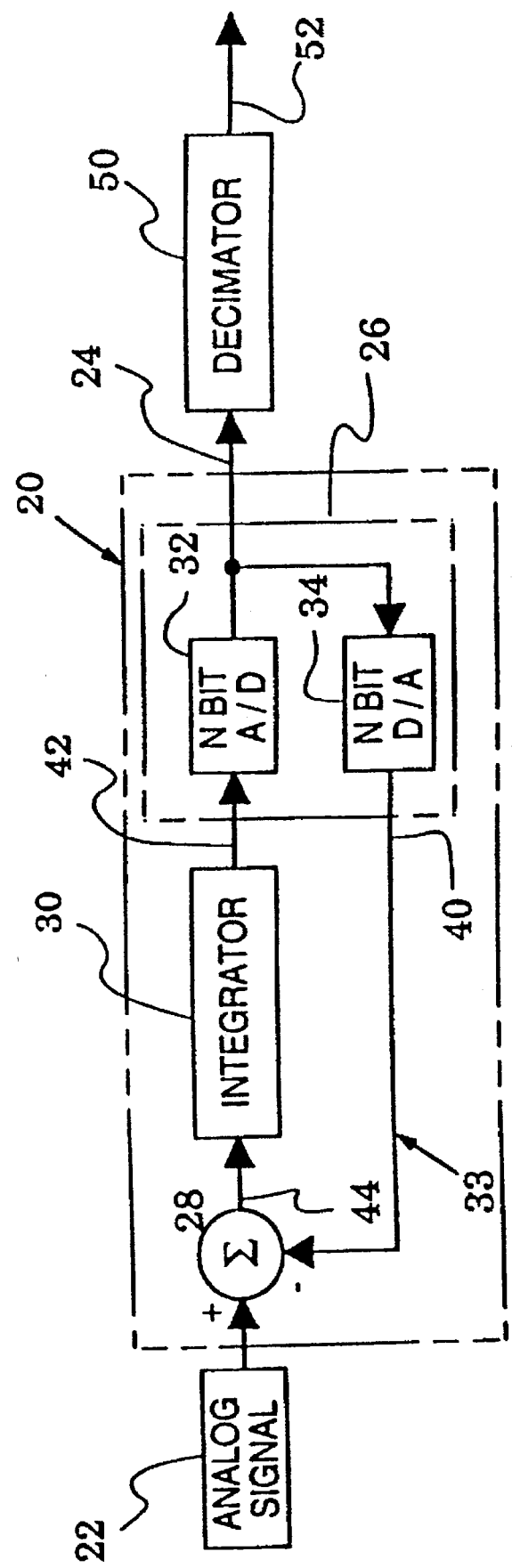
FIG. 1 is a block diagram of a delta-sigma modulator connected between an analog signal and a decimator.

FIG. 1 is a block diagram of a prior art oversampling A/D modulator 20 of a type described in Oversampling Delta-Sigma Data Converters, edited by James C. Candy and Gabor C. Temes, IEEE Press, 1992, New York. The modulator 20 responds to an analog input from signal source 22 to produce a bit stream output 14. The modulator 20 includes a differencer 28 having a + input terminal to which the analog input is applied. The output of differencer 28 is connected through an integrator 30 to an N bit A/D converter 32 which produces the output bit stream 24. A feedback loop 33, from the output of converter 32 to the − input terminal of differencer 28, includes an N bit D/A converter 34. Configurations of the modulator 20 using single bit converters 32, 34; i.e., where N=1, are generally referred to as delta-sigma modulators. The portion of the modulator 20 comprised of converters 32 and 34 is frequently referred to as a quantizer 26.

In operation, the converter 32 produces a bit stream output 24 responsive to the output 42 of integrator 30. Converter 34 produces an analog output 40 comprising a somewhat coarse analog estimate of the output 42. The output 40 is subtracted from the analog input 22 at the differencer 28 to form a quantizer error 44. Integrator 30 integrates this error 44 to form an integrated quantizer error over time at its output 42. The negative feedback of the loop acts to minimize the integrated quantizer error over time so that the average value of the encoded signal representation, at the modulator output 24, is forced to track the average analog input from source 22.

A decimator/low pass filter 50 removes the noise produced by the modulator's coarse quantization and processes the bit stream 24 to produce, at its output 52, a finer approximation of the input signal 22 at a lower rate (e.g., the Nyquist rate). As stated in the above cited reference, oversampling modulators can use simple and relatively high-tolerance analog components which facilitates their realization in modern very large scale integration (VLSI) techniques.

The present invention is based on the recognition that basic delta-sigma modulator principles can be utilized in a time multiplexed system for processing an array of analog signal inputs. This recognition leads to improved implementation of various devices, e.g., video imagers, which can be realized in modern integrated circuit techniques with significant cost, reliability and size advantages.

Figures 2A, 2B:
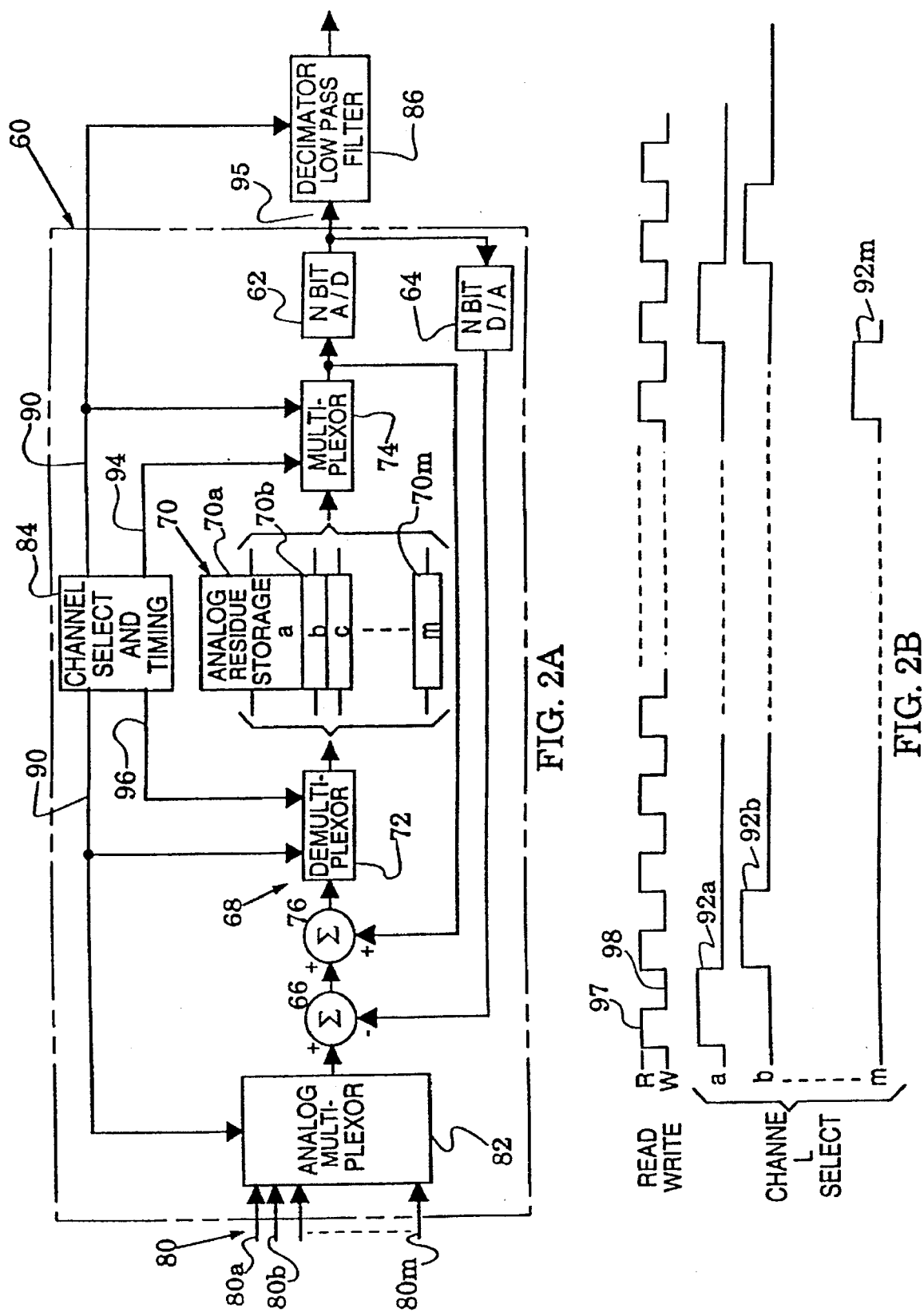
FIG. 2A is a block diagram illustrating a preferred embodiment of a multiplexed oversampling analog to digital modulator in accordance with the present invention.
FIG. 2B is a timing diagram pertaining to the modulator of FIG. 2A.

Attention is now directed to FIG. 2A which illustrates an initial embodiment of the invention in the time multiplexed analog to digital modulator 60. The modulator 60 includes, in an arrangement similar to the feedback loop 33 of the modulator 20, an N bit A/D converter 62, an N bit D/A converter 64 and a differencer 66. However, the integrator of the modulator 60 is comprised of a secondary feedback loop 68 including analog memory 70, demultiplexor 72, multiplexor 74 and summer 76 which together form a sampled data integrator.

A plurality of analog signals 80 are time multiplexed to the differencer 66 through an input multiplexor 82 under command of a channel select and timing circuit 84. The channel select and timing 84 can command the demultiplexor 72 and multiplexor 74 to access, for each input signal 80, a corresponding storage location in the memory 70 (e.g., signal 80a has a corresponding storage location 70a). In a manner similar to the modulator 20, the modulator 60 output is processed through a decimator/low pass filter 86.

The concept of the modulator 60 may be addressed with reference to both FIG. 2A and the modulator timing diagram of FIG. 2B. Through the channel select lines 90, shown in FIG. 2A, the channel select and timing 84 can, in a repeating time sequence, command the input multiplexor 82 to direct signals 80a, 80b - - - and 80m to the differencer 66 and, in a corresponding time sequence, command the demultiplexor 72 and multiplexor 74 to access memory locations 70a, 70b - - - and 70m. The channel select sequence is indicated by high channel select signal conditions 92a, 92b - - - and 92m in FIG. 2B.

During a first portion of the high signal condition 92a, the channel select and timing 84 commands, through a read line 94, an analog residue (the integrated quantizer error of the modulator 20 in FIG. 1), presently stored in memory location 70a, to be read, via the multiplexor 74, into the summer 76 and the A/D converter 62. The A/D converter 62 and D/A converter 64 place a quantized estimate of this present residue at the differencer 66 and a digitally encoded representation at the input 95 of the decimator 86. The present estimate is differenced (subtracted) at the differencer 66 from the present value of the input signal 80a to form a present error which is summed in the summer 76 with the present residue to form a new analog residue.

During a remaining portion of the high signal condition 92a, the channel select and timing 84 commands, through the write line 96, the demultiplexor 72 to write the new analog residue into the memory location 70a. In the timing diagram of FIG. 2B, the read and write time portions of the high channel select signal condition 92a are indicated by the high 97 and low 98 conditions of the read/write select signal which appears on the read line 94 and write line 96 in FIG. 2A. This process for forming and writing a new analog residue is analogous to the coarse estimate subtraction and integration of the modulator 20 of FIG. 1.

This processing, including reading present stored residues from the memory 70 and writing new residues to the memory 70, is repeated for each of the other input signals 80 during their corresponding high channel select conditions 92b - - - 92m after which, the sequence repeats. Thus, for each input signal, modulation results in present analog residues being replaced with new analog residues to maintain the integrity of the quantizer error integration history. This enables time multiplexed oversampled analog to digital modulation of the plurality of analog input signals 80.

It should be understood that FIG. 2B illustrates general residue read/write timing relationships of the modulator 60 of FIG. 2A and is not intended to limit the order or time duration devoted by the modulator 60 to each input signal 80 to the particular sequence shown.

Oversampled modulation theory, as described in the above cited reference, indicates that selecting the value of N, for the N bit A/D converter 62 and the D/A converter 64, at a higher number increases the signal-to-noise ratio (equivalently, the number of bits of resolution) achieved by the modulator 60 for a given oversampling rate. On the other hand, selecting the value at a lower number (e.g., one) simplifies the modulator 60 structure.

Figure 3A:
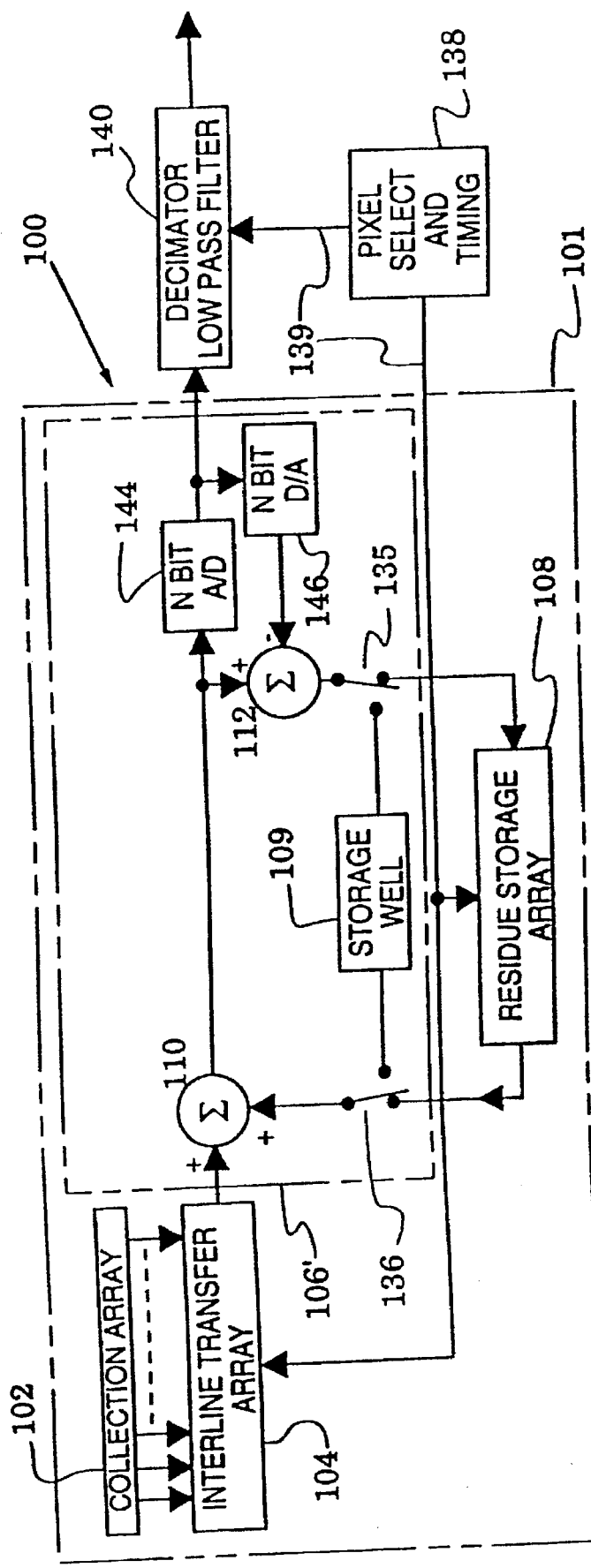
FIG. 3A is a block diagram of a preferred optical imager embodiment in accordance with the present invention.

FIGS. 3A and 3B respectively depict a block diagram and a schematic diagram of another preferred embodiment, in accordance with the present invention, intended to be mounted coincident with the focal plane 101 of an optical imager 100, e.g., a video camera. In contrast to the modulator 60 of FIG. 2A, the imager 100 has its analog input signals generated by a light sensitive (including visible, infrared and ultraviolet) image collection array 102. An interline transfer array 104 then multiplexes and transfers these signals to modulators 106 associated with columns of a residue storage array 108 (for clarity of illustration the modulators 106 of FIG. 3B are shown as a single modulator 106' in the block diagram of FIG. 3A).

In the embodiment of FIG. 3B, the interline transfer array 104 functions to perform the m-to-1 multiplexing function of multiplexor 82 of FIG. 2A. The residue storage array 108 analogously performs the 1-to-m demultiplexing function of demultiplexor 72 and the m-to-1 multiplexing function of multiplexor 74. More particularly, the arrays 102, 104 and 108 are each arranged in an orthogonal relationship with 1 through x columns (indicated at the top of the focal plane 101 for arrays 102, 104 and along columns of the array 108) and m elements in each column, i.e., m rows. A modulator 106 is disposed between each column of the transfer array 104 and an associated column of the residue storage array 108.

To simplify the flow of charges through the modulators 106, the summer 110 and differencer 112 of each modulator have been transposed (a mathematically equivalent operation) from their corresponding positions in the modulator 60 of FIG. 2A. In addition, columns of the memory 108 are arranged in the feedback leg of the modulator feedback loop rather than the feedforward leg as in the modulator 60 and a separate storage well 109 is associated with each modulator.

The arrays 102, 104 and 108 and storage well 109 are preferably fabricated in charge control device (CCD) structures. Such structures, and methods of moving electrical charges along CCD wells thereof, are well known in the imager art. The signals modulated in the imager 100 are charge potentials collected for picture elements (pixels) of the focal plane 101 by the collection array 102. The collection array 102 is comprised of light sensitive collection wells 122 (also indicated by the letter C for collection), each associated with a different pixel. Light photons falling on the silicon gate surface of each CCD collection well 122 generates a signal charge which is collected in a depletion well in the semiconductor substrate beneath the gate.

These light induced charges are integrated into the collection wells 122 over a predetermined optical frame time period (e.g., 1/30 of a second in a typical television system) after which each column of charges are parallel shifted into transfer wells 128a, 128b, - - - 128m of an adjacent transfer column. The CCD registers forming each transfer column then transfer the collected charge potentials serially downward to the modulators 106. The columns of the collection array 102 and the interline transfer array 104 are arranged in an interleaved relationship to facilitate the parallel transfer of charges therebetween. A pixel select and timing circuit 138 controls the flow of charges along the CCD structures of the arrays 102, 104 and 108 as required for modulation in the modulators 106 and provides timing to the decimator/low pass filter 140 for pixel identification of elements of the bit stream from the focal plane 101.

When the modulator switches 135, 136, connected to a storage well 109 and an associated storage array column 156, are in positions 135', 136' of FIG. 3B, charge potentials from a column 128 of the transfer array 104 may be sequentially presented at a summer 110 along with a corresponding present residue value from an output storage element 156m of the associated column 156 of the residue storage array 108. The summed charge is quantized in the analog quantizer formed by the A/D converter 144 and D/A converter 146 and the resulting estimate differenced from the summed charge in the differencer 112 to form a new residue which is moved into the input storage element 156a of the column 156 of the residue storage array 108. As the quantization was performed, the A/D converter 144 digitally encoded the estimate and placed it on the CCD register 145 to be transferred off the focal plane 101 to the decimator 140.

After all m charge potentials from a column 128 of the transfer array 104 have been sequentially processed through the corresponding modulator 106 it should be apparent that the new residue values lie in the CCD wells of the residue storage array column 156 that correspond to wells of the transfer array column 128 from which the charges were transferred. The charge potentials that have, meanwhile, collected in the collection array 102 during the latest frame period may now be transferred via the transfer array 104 to the modulators 106 to start another modulation cycle.

As an alternative to the modulation cycle described above, after each charge potential from a column 128 of the transfer array 104 is presented at the corresponding modulator 106 along with the present residue from a corresponding column 156 of the storage array 108, the switches 135, 136 may be placed in the positions 135", 136" of FIG. 3C (a schematic of one modulator 106 and an associated residue storage array column). While each charge potential remains presented at the summer 110, it may be modulated a plurality of times through the modulator, each time reading a present residue value from the storage well 109 to the summer 110 and writing the resulting new residue into the storage well 109 from the differencer 112. The final residue of this processing may then be placed in the residue storage array column 156 with the switches in the positions 135', 136' of FIG. 3A which shifts the next present residue from the storage array column 156 to the summer 110. At the same time the next charge potential from the transfer array 104 is presented to the modulator 106 and the switches returned to the positions 135", 136" to repeat the process.

This is continued until each charge potential from a column 128 of the transfer array 104 has been modulated a plurality of times and its final residue stored in its corresponding well of a column 156 of the residue storage array 108. In this manner a higher oversampling rate is achieved to increase the resolution of the digital representation of the charge potentials.

Figure 3D:
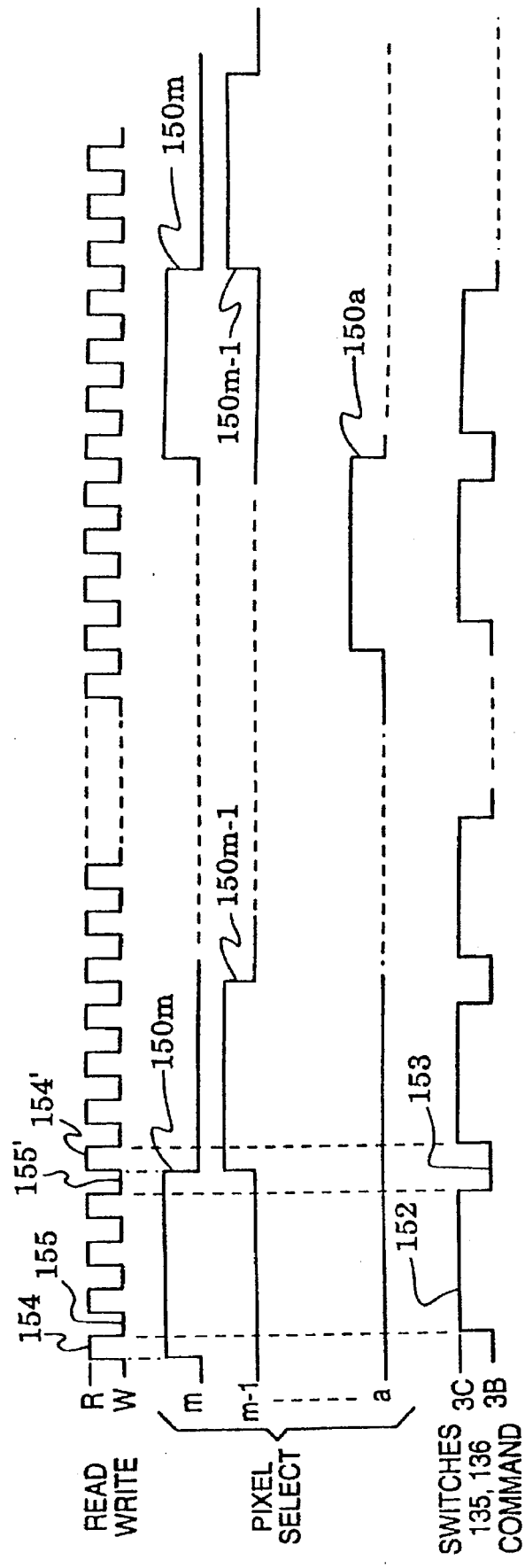
FIG. 3D is a timing diagram pertaining to the modulator of FIGS. 3A, 3B and 3C.

The above described process, which enables modulation to dwell on a pixel charge potential independently of collection array 102 frame periods, may be more easily visualized with the aid of the timing diagram of FIG. 3D which illustrates, with the aid of FIGS. 3B, 3C, a specific charge potential modulation example. In FIG. 3D the pixel select high signal conditions 150m, 150m-1, - - - 150a indicate the times during which each of the charge potentials, which were parallel shifted from the collection array 102 into the transfer array wells 128m, 128m-1, - - - 128a at the end of a frame period, are presented at the summer 110.

The signal conditions 152, 153, of the switches 135, 136 command signal, respectively, indicate the times during which the switch positions 135", 136" of FIG. 3C and 135', 136' of FIG. 3B are established. Finally, the high 154 and low 155 signal conditions of the read/write reading of a present represent reading of a present residue through the switch 136 (from the storage well 109 or associated storage array column 156) to the summer 110 and writing of a new residue from the differencer 112 through the switch 135 (to the storage well 109 or associated column 156).

After the charge potential originally in transfer well 128m is presented at the summer 110 (high signal condition 150m) and the residue stored in well 156m of the residue storage array has been written to the summer 110 (read signal 154), the switches 135, 136 are moved from positions 135', 136' to positions 135", 136" and the new residue written into the storage cell 109 (write signal 155).

In this example, three more cycles of reading and writing of residues then follow. Prior to the last write command of these cycles (write signal 155'), the switch command goes to the 153 condition which places the switches in the 135', 136' position of FIG. 3B so that the final residue is stored in storage well 156a. The switch command remains in the 153 condition until the read command 154' is completed which places the next residue in the storage column 156 (originally in well m-1) at the summer 110 for a modulation cycle as just described above.

Continuing with the sequence of high signal conditions 150 in FIG. 3D, it should be apparent that at the conclusion of the high 150a pixel select signal, each charge potential shifted from a collection array column into a transfer array column 128 at the end of a frame period, has been cycled through four modulation cycles, beginning with its corresponding residue from a residue storage array column 156, and the final residue placed back in the corresponding well of the storage array column 156.

It should be understood that the arrangement in FIG. 3B in which a modulator 106 is devoted to one column of the arrays 102, 104 is but one embodiment of the invention and numerous equivalent arrangements can be devised (e.g., several CCD array columns can be daisy chained to one modulator). To simplify the circuits of the imager 100, the A/D converters 144 and the D/A converters 146 may be configured as single bit converters.

Another preferred optical imager embodiment 160, arranged on a focal plane 161, is illustrated in the block diagram and schematic diagram of, respectively, FIGS. 4A and 4B. The imager 160 differs primarily from the imager 100 in that an interline integration array 162 performs the transfer, storage and integration functions associated with the interline transfer array 104, storage array 108, storage well 109 and summer 110 of the imager 100.

In a manner similar to the imager 100, the interline integration array 162 and a light sensitive collection array 164 are arranged in an orthogonal relationship with m elements in each of x columns. However, in the imager 160 the charges in the integration wells 166 are not transferred to another site but rather are run through a modulation cycle and the resulting new residue returned to the associated integration well.

Thus, at the end of each succeeding frame period, the charges from a collection well 168 are added to the existing charges in a corresponding integration well 166 rather than being shifted into an empty transfer well. Therefore, the integration array 162 serves as the modulation integrator as well as storage for modulation residues.

The columns of the collection array 164 and integration array 162 are interleaved by pairs to facilitate cycling the charges of the integration array 162 through a modulation cycle. As seen in FIG. 4B, charges can thus be transferred across the top of two integration columns 169, as indicated by the arrow 170, and through the remainder of the modulator at the bottom. In the imager 160, therefore, each pair of integration columns 169 and an associated modulator portion 172, containing an N bit A/D converter 174, an N bit D/A converter 176 and a differencer 178, form each modulator (for clarity of illustration only one modulator portion 172' is shown in the block diagram of FIG. 4A).

As the integrated charges of an associated pair of integration array columns 169 are processed through the modulator portion 172, they are each quantized in the N bit A/D converter 174 and the N bit D/A converter 176 to form an estimate which is differenced, in the differencer 178, from the original charge to form a new residue which is returned to the associated intergration well. The processing continues at the end of each succeeding frame period when the collected charges from the light sensitive CCD wells 168 are summed with the residue in each corresponding integration well 166 and the modulation repeated to form and store new residues. The modulation of all residues in a pair of integration columns 169 may be completed once each frame period or, for increased resolution of the analog to digital conversion process, a plurality of times each frame period. The only requirement is that new residues are returned to their corresponding integration wells 166 prior to shifting of charges from the collection array 164.

As described above for the imager 100, the number of bits of the A/D converter 174 and D/A converter 176 may be increased to achieve a higher signal-to-noise ratio for a given oversampling rate or decreased to achieve structural simplicity. Pixel select and timing electronics 180 provides timing signals to the interline integration array 162 for moving charges along its CCD structure and to a decimator/ low pass filter 182 for identification of elements of the bit stream from the focal plane 161. The modulated bit stream from the A/D converters 174 are transferred to the edge of the focal plane 161 by a CCD register 184.

Figure 5:
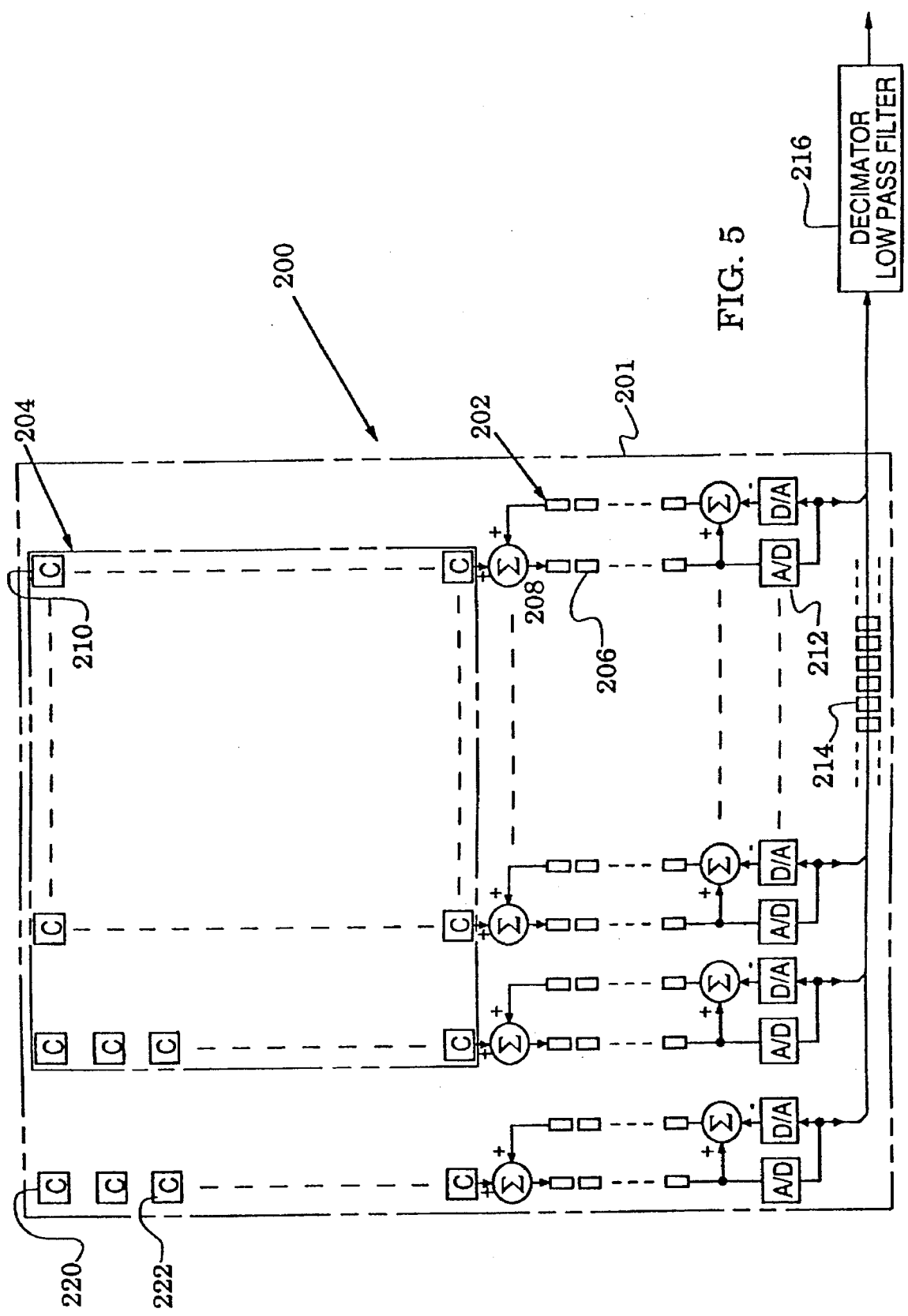
FIG. 5 is a schematic diagram of another preferred optical imager embodiment.

Another preferred imager embodiment 200 on a focal plane 201 is illustrated in the schematic diagram of FIG. 5. The imager 200 differs from the imager 160 in that a frame transfer/integration array 202 is spaced from a collection array 204 rather than being interleaved therewith as in the case of the interline integration array 162 of FIG. 4B. Each column 206 of the frame transfer/integration 202 is folded and connected at one end through a summer 208 to an associated collection column 210 to facilitate passing charges around the column 206 for a modulation cycle.

Present residues in the frame/transfer array 206 wells are cycled and integrated with corresponding charges shifted downward from the collection array 204 at the end of each frame period and modulated to new residues each time they are passed around the folded columns for a modulation cycle. The encoded bit stream from the analog to digital converters 212 is transferred across a CCD register 214 to the edge of the focal plane 201 and then to a decimator/low pass filter 216.

The focal plane 201 of the imager 200 also has a column 220 of light insensitive CCD wells 222 for collecting other signal inputs associated with the image focused on the array 204 (e.g., multichannel audio, light intensity control). These signals are modulated and multiplexed onto the CCD output register 214 with the modulation from the light sensitive wells of the collection array 204.

Thus the focal plane 201 includes a structure of analog signal collecting devices responsive to an energy pattern incident on the focal plane 201 wherein the energy pattern is modulated by the imager 200 into a representative multiplexed bit stream. The energy sensitive structure is defined by a combination of light sensitive devices for receiving an image focused on the focal plane and analog signal sensitive devices for receiving image associated signals.

Figure 6:
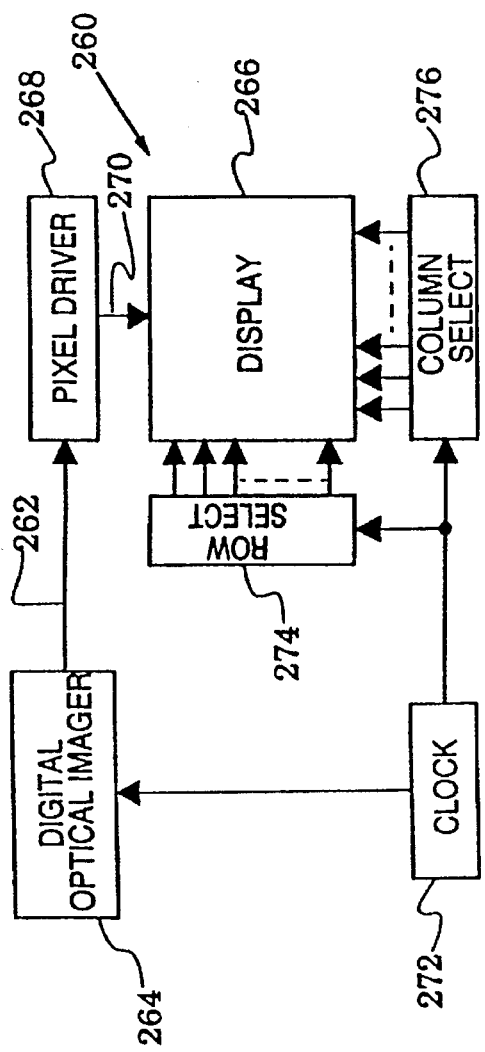
FIG. 6 is a block diagram of an optical imager and monitor system in accordance with the present invention.

FIG. 6 is a block diagram illustrating an optical imager/monitor system 260 in which an image represented by a bit stream 262 from an imager 264, in accordance with the present invention (e.g., optical imager embodiments 100, 160 and 200), is monitored on a display 266. The display 266 can be any display having visible display elements that can be driven on or off (e.g., electro-illuminescence, liquid crystal) and which are arranged in accordance with the picture elements of the focal screen of the imager 264.

A pixel driver 268 decodes the bit stream 262 (opposite process of the encoding in the imager 264) and applies corresponding signals 270 appropriate to the type of display elements in the display 266. A clock 272 and row and column select circuits 274, 276 demultiplexes the signal 270 to display elements of the display 266 in accordance with the manner in which charge potentials of picture elements of the imager 264 focal plane were multiplexed onto the bit stream 262.

The average luminosity of each display element will be the average of the on and off duration of the imager digital output signal for each pixel. Since the human eye will integrate anything changing faster than 60 hertz, the modulated display element will appear to be a constant level (given that the imager 264 is operating at modulation rates higher than 60 hertz). The bit stream 262 contains the original analog spectrum of light intensity at each picture element of the focal plane of the imager 264. The average pulse density at the display element over a Nyquist sample interval will equal the average light intensity at the corresponding picture element of the imager 264 focal plane to within the sampling resolution. In a similar manner, the bit stream 262 could be recorded on magnetic tape for later application to a display monitor.

The teachings of the invention may be extended to higher order modulation feedback loops, which are described in the above cited reference, to achieve a higher signal-to-noise ratio (higher resolution in number of bits) for a given sampling rate. Higher order loops, however, also increase circuit complexity.

Figure 7:
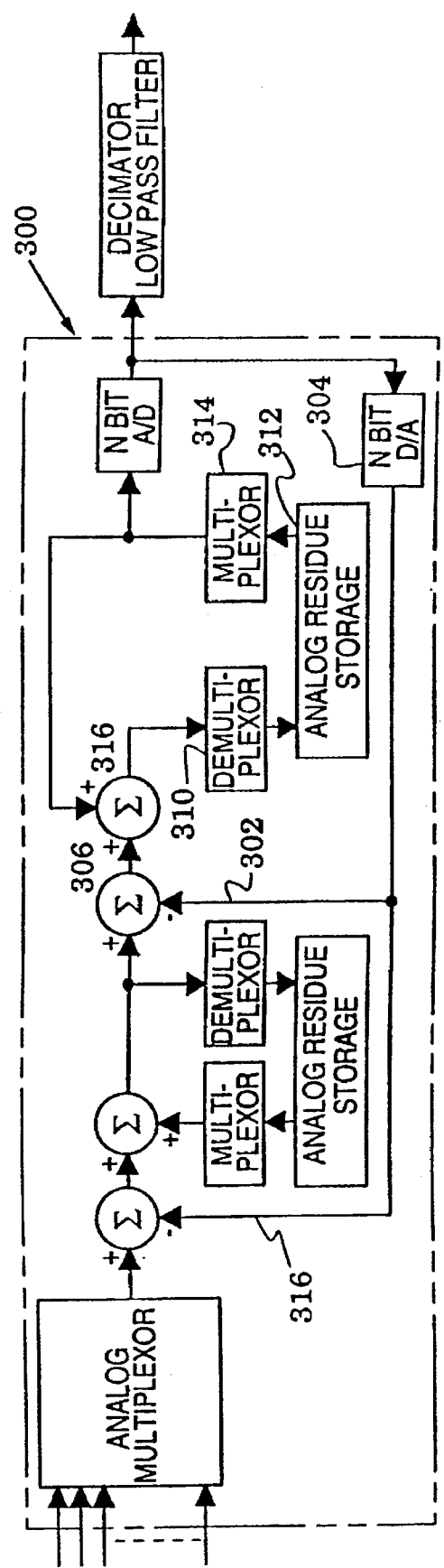
FIG. 7 is a block diagram of another preferred multiple input analog to digital oversampling modulator embodiment.

One embodiment of the invention illustrating their use is shown in the block diagram of a multiplexed analog to digital modulator 300 of FIG. 7. Compared to the modulator 60 of FIGS. 2A, 2B, the modulator 300 has a second order feedback loop 302 wherein the quantizer estimate is fed back from the D/A converter 304 to a differencer 306. A demultiplexor 310, memory 312 and multiplexor 314 are positioned in the feedforward leg of this second loop with local feedback to the summer 316. For timing purposes the demultiplexor, memory and multiplexor of the first feedback loop have been positioned in the feedback leg.

In the description above of the optical imager 100 embodiment, it was stated that the arrays 102, 104 and 108 and storage well 109 are preferably fabricated in charge control device (CCD) structures. It will now be shown that multiplexed oversampled analog to digital modulation embodiments may be realized in other integrated circuit technologies.

Figure 8:
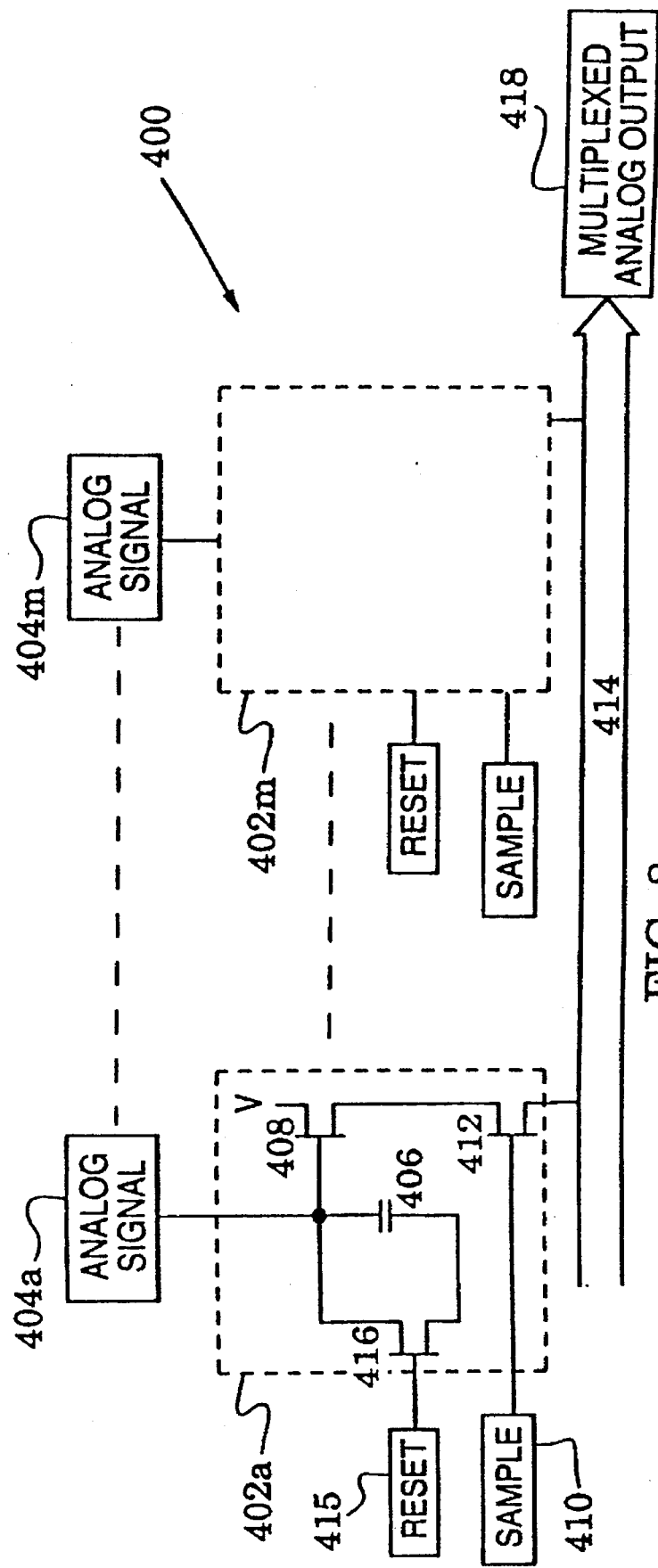
FIG. 8 is a schematic diagram of a typical focal plane analog readout system.

FIG. 8 is a schematic diagram of a system 400 typically used in the imaging art as a focal plane analog readout. In this system, an integrate and dump circuit 402a accumulates an optical signal from a buffered source 404a in the capacitor 406. The voltage developed across the capacitor 406 is applied to the gate of an FET source follower 408.

The source follower 408 is periodically sampled in response to a sampling signal 410 applied to a FET gate 412 and the sampled voltage multiplexed onto a bus 414. The capacitor 406 is then discharged by applying a reset signal 415 to FET 416 which clears the capacitor 406 for the next charge and sample cycle. While the capacitor 406 accumulates the next charge, other signal sources, for example the source 404m, are sampled and multiplexed to the bus 414. Thus, the system 400 produces a multiplexed analog output 418 from a focal plane.

Figure 9:
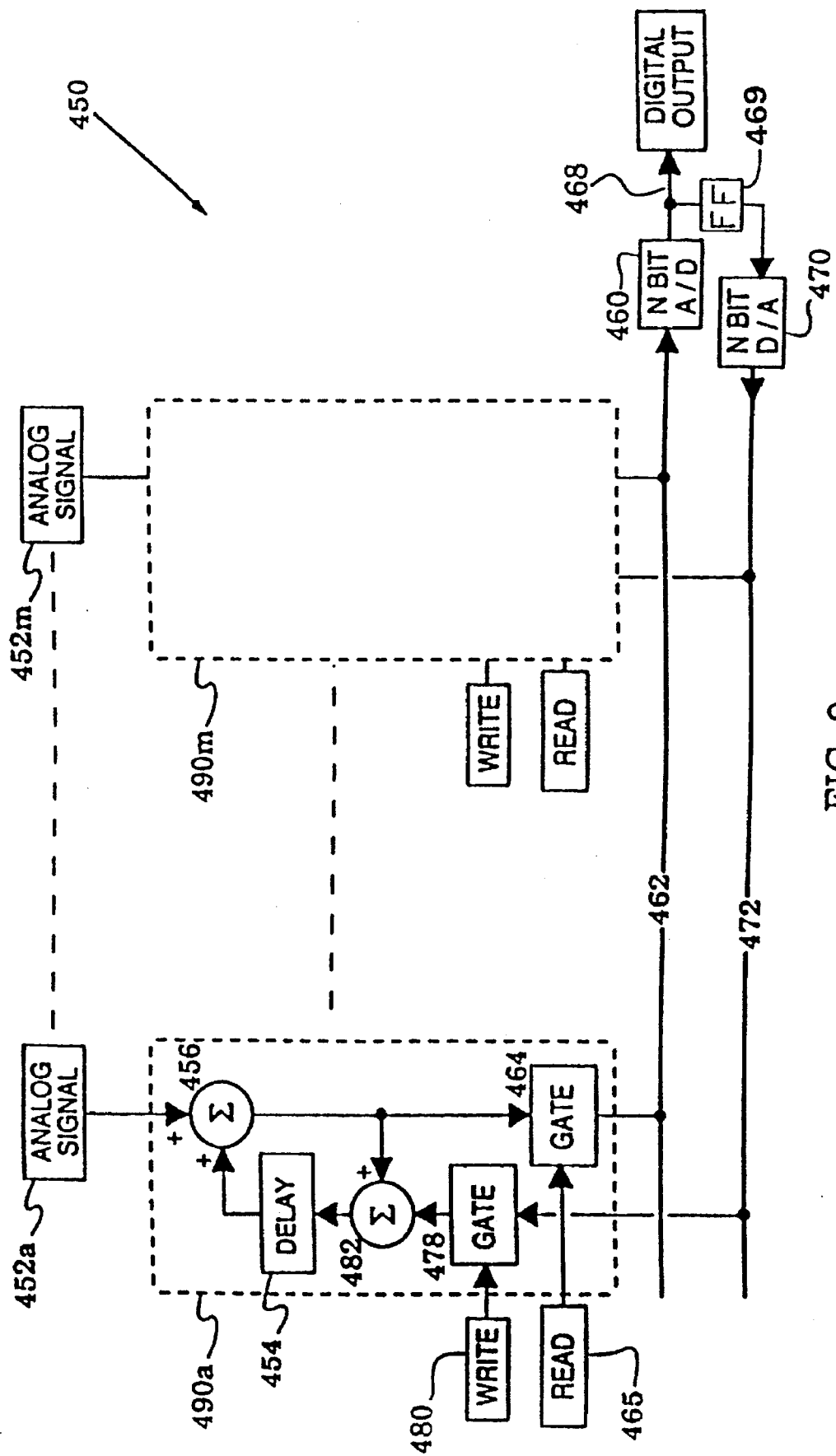
FIG. 9 is a block diagram of an analog to digital modulator in accordance with the invention.

Multiplexed analog sampling circuits, such as the focal plane readout of FIG. 8, can, in accordance with the invention, be replaced with the multiplexed oversampled analog to digital modulator 450 illustrated in the block diagram of FIG. 9. In the modulator 450, an analog signal 452a is integrated by feedback of the signal through a delay 454 to be summed with itself in a summer 456. The integrated signal (present residue) is periodically multiplexed to an N bit A/D 460 by placing it onto a bus 462 through a gate 464 in response to a read signal 465. The N bit A/D 460 produces a digital bit stream output 468 representative of the integrated signal and an N bit D/A 470, responsive to the bit stream 468 captured in a flip flop 469, places a quantized estimate thereof on the bus 472.

The quantized estimate is clocked through a gate 478 by a write signal 480 to be subtracted in a differencer 482 from the present residue and summed with the present value of the analog signal 452a to form a new analog residue at the output of the summer 456. The integration, subtraction and gating functions comprise a circuit 490 which is also provided for each of the other analog signals, e.g., circuit 490m for analog signal 452m. Each of these circuits 490 are time multiplexed onto the buses 462, 472 as described above for the circuit 490a.

Thus, for each analog signal 452, a circuit 490 is periodically connected in a feedback loop, including the N bit A/D 460 and the N bit D/A 470, for modulation which produces a representative bit stream 468 at the output of the N bit A/D and an updated residue value from a summer 456.

The multiplexed oversampled analog to digital modulator of FIG. 9 may be realized in a variety of integrated circuit technologies, e.g., charge modulation device (CMD)), bulk charge modulation device (BCMD), base-stored image sensor (BASIS), static induction transistor (SIT), lateral APS, vertical APS and double-gate floating surface transistor. Specific embodiments directed to realization in Complimentary Metal Oxide Semiconductor (CMOS) technology and in mixed CCD and transistor technologies are respectively illustrated in FIGS. 10 and 11.

Figure 10A:
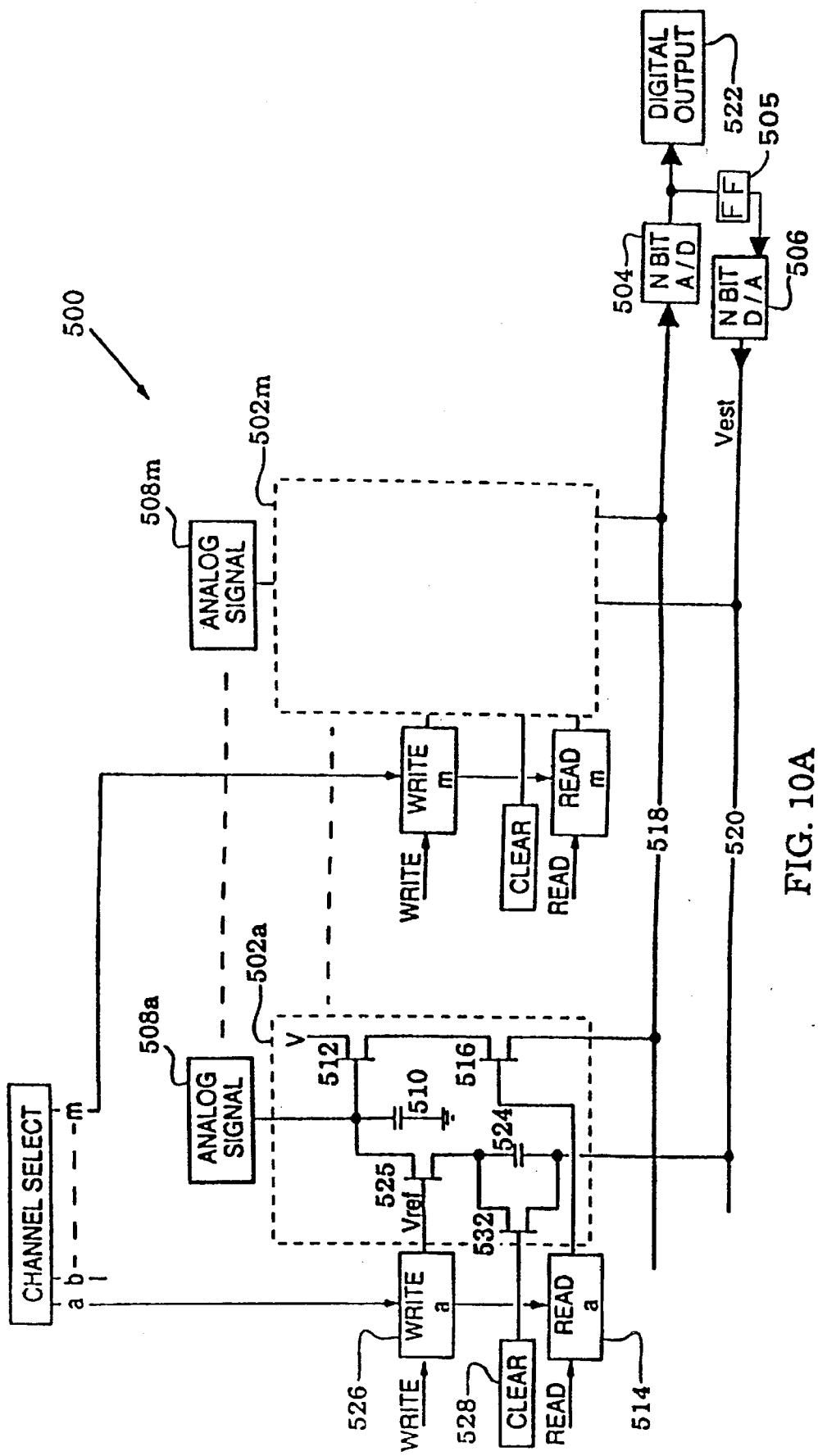
FIG. 10A is a schematic diagram of a multiplexed oversampled analog to digital conversion system incorporating the modulator of FIG. 9.

FIG. 10A shows a multiplexed oversampled analog to digital conversion system 500 having a plurality of integration, subtraction and gating circuits 502a - - - 502m multiplexed to a feedback loop including an N bit A/D 504, a flip flop 505 and an N bit D/A 506. In addition to FIG. 10A, the following description of the system 500 will refer to the timing diagram of FIG. 10B. In the circuit 502a, an analog signal 508a is collected on integration capacitor 510 which is buffered by source follower 512. Channel select signals through m are sequentially applied to the circuits 502. During a first portion of the channel a select period, read a signal 514 goes high to switch FET 516 which connects the circuit 502a via the bus 518 to the N bit A/D 504.

Therefore, the N bit A/D 504 places a bit stream at the output 522 which is representative of the charge (present analog residue) on the capacitor 510. In response to the bit stream captured by flip flop 505, the N bit A/D 506 places a voltage Vest (quantized estimate) on the bus 520 which makes it available at the lower end of a subtraction capacitor 524. The subtraction capacitor 524 is connected to the integration capacitor 510 by FET 525.

In the last portion of the channel a select period, write a signal 526 goes high which causes a reference voltage Vref to be placed on the gate of FET 525. Consequently a charge equal to the quantity (Vest−Vref)/C, where C is the capacitance of the capacitor 524, is subtracted from integration capacitor 510 (where the FET 525 is assumed to be an ideal transistor having no voltage drop between gate and source). Prior to the write a pulse 526, a brief clear pulse 528 is placed on the gate 532 which is in parallel with the subtraction capacitor 524. This removes all charges from the subtraction capacitor 524 to prepare it for the write pulse.

Figure 10B:
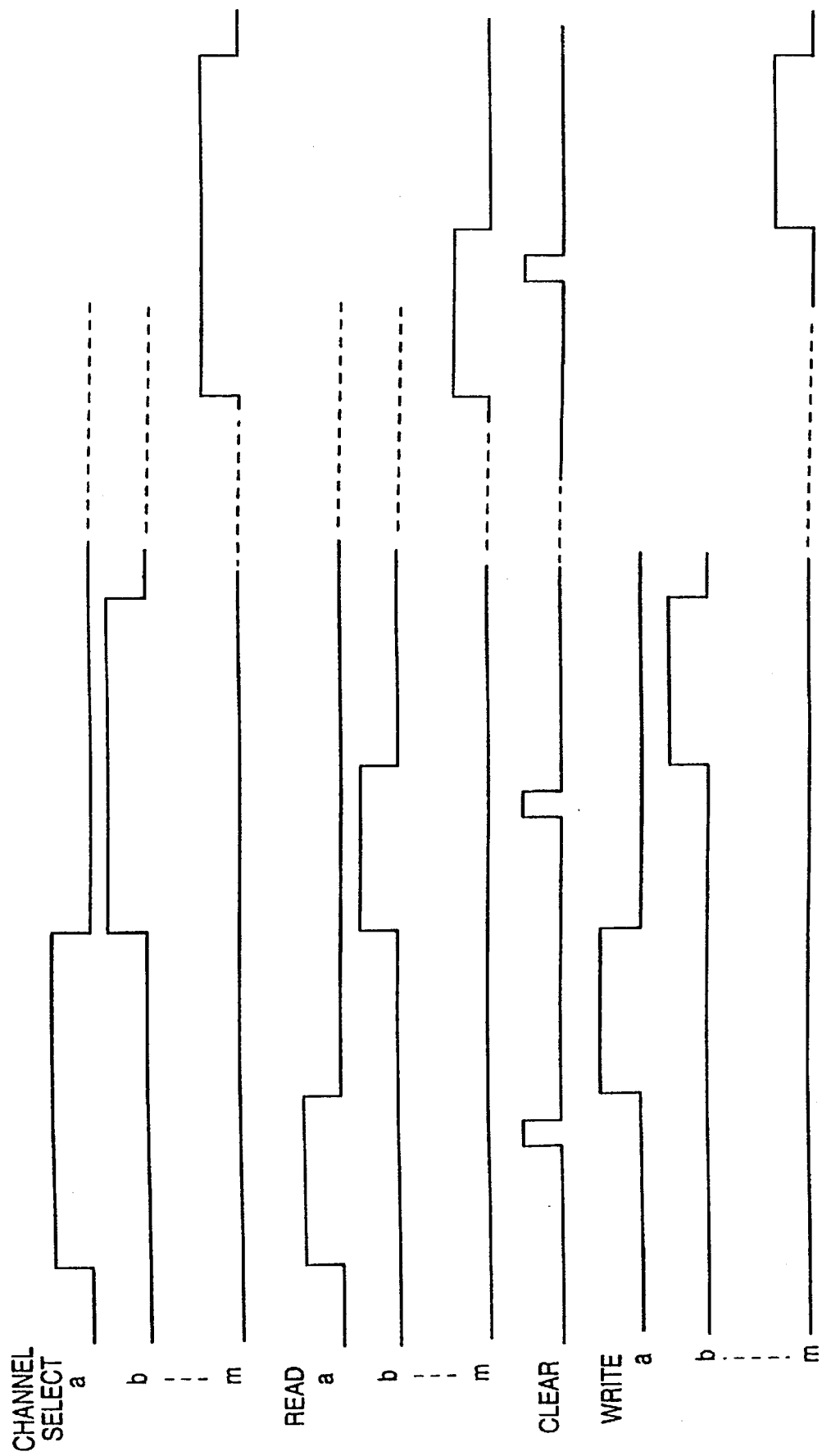
FIG. 10B is a timing diagram of the system of FIG. 10A.

When the write a signal 526 and read a signal 514 are both low, the analog signal 502a is again integrated in capacitor 510. Thus a quantized estimate of the present analog residue has been subtracted and the present analog signal added to store a new analog residue on the capacitor 510. In a similar manner, each of the other analog signals 508m is multiplexed to the N bit A/D 504 and N bit D/A converter 506. In FIGS. 10A, 10B, it is assumed the clear signal 528 is common to each circuit 502 so that it is high prior to each write signal 526.

Figures 11A, 11B:
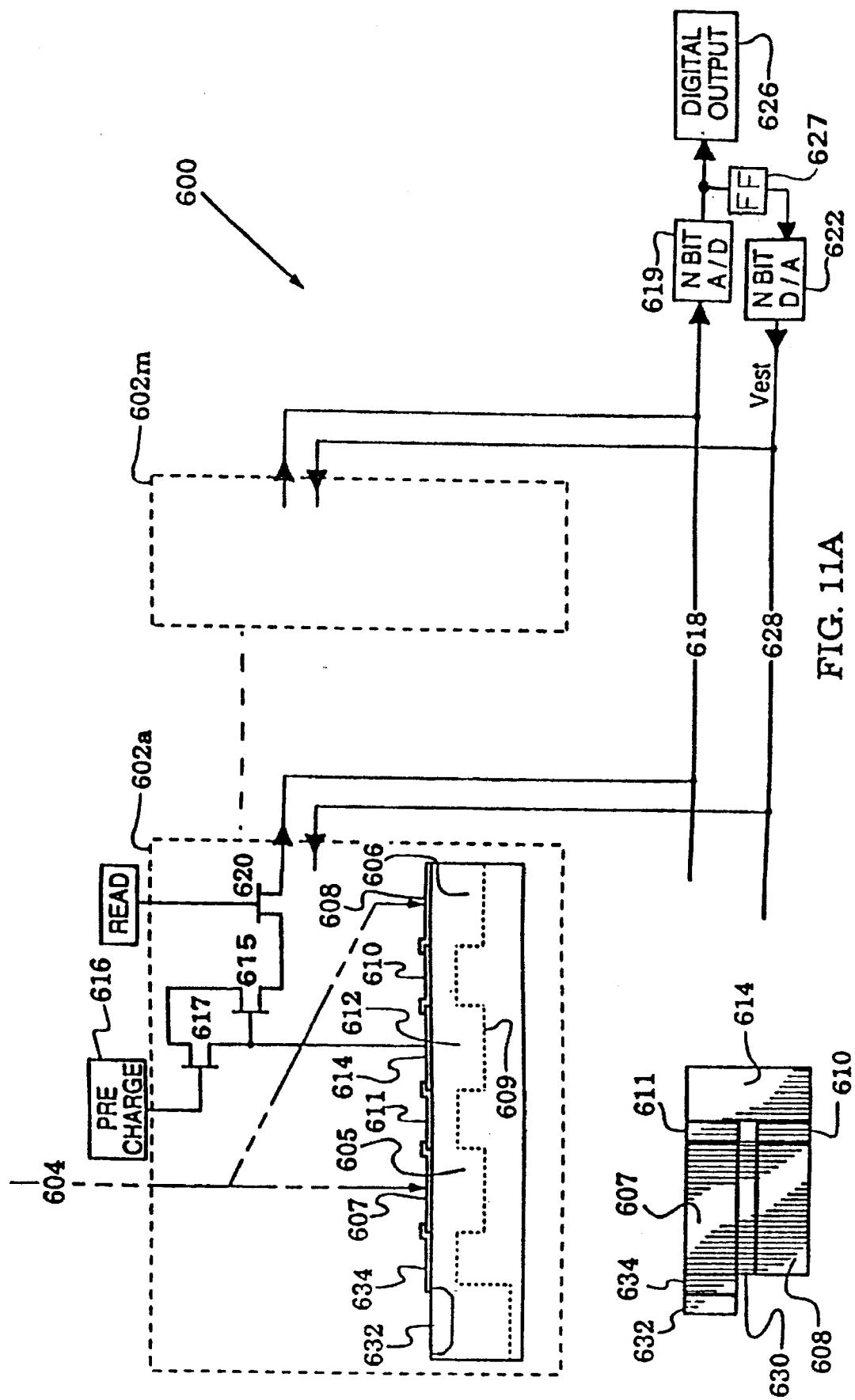
FIG. 11A is a schematic diagram of another multiplexed oversampled analog to digital conversion system incorporating the modulator of FIG. 9.
FIG. 11B is a plan view of the CCD structure of a sensor circuit of FIG. 11A.

FIG. 11A illustrates an active pixel sensor (APS) 600 combining a plurality of sensor circuits 602 in a multiplexed oversampled analog to digital modulation mode. The embodiment 600 combines CCD integration and subtraction with CMOS sampling, readout and multiplexing.

In a representative sensor circuit 602a, an analog signal produced by an image light ray 604 is integrated, during a charge cycle, in CCD wells 605, 606 beneath photogates 607 and 608. The wells are defined by a potential 609 indicated in broken lines. The integrated charge of both wells is then transferred via transfer gates 610, 611 and summed into the CCD well 612 from where a voltage proportional to the summed charge is available via sense gate 614 and source follower 615 (timing precharge 616 applied through the gate of FET 617 is required to create the well 612). Periodically, this voltage is multiplexed over a bus 618 to N bit A/D 619 by a read command applied to FET 620.

As in the system 500 of FIG. 10A, the N bit A/D 619 places a bit stream representative of the summed charge at an output 626. The N bit D/A 622, in response to the digital output 626 captured in a flip flop 627, places a voltage Vest on the bus 628 to enable the subtraction of a quantized estimate from the summed charge in CCD well 612.

To effect this subtraction, the CCD wells 605, 606 are separated by a potential barrier 630 shown in FIG. 11B which is a plan view of the sensor circuit 602a CCD structure. The height of the potential barrier 630 is proportional to the voltage Vest. A signal is also applied to transfer gates 610, 611 which causes the summed charge in CCD well 612 to flow into CCD well 605 with the excess charge flowing over the potential barrier into CCD well 606. For nonzero digital outputs, CCD well 605 is then emptied into the diffusion 632 by a signal applied to the drain gate 634. The subtracted (emptied) charge is, therefore, proportional to the output voltage of the N bit A/D 622.

Therefore, a quantized estimate is subtracted and during the next integration cycle, the input signal 604 is integrated into CCD wells 605, 606 to form a new residue charge. The formation of wells 605, 606 and 612 and movement of charges therebetween as described above is well known in the CCD art.

From the foregoing, it should now be recognized that embodiments for multiplexed oversampled analog to digital conversion have been disclosed herein utilizing means for preserving modulation integration history for each of an array of analog input signals (array as used herein refers generally to a plurality of input signals and more particularly, where specified, to a plurality arranged in a physical relationship, e.g., orthogonally as in the arrays 102, 104 and 108 of FIG. 3A).

The described embodiments can be implemented using various circuit implementations including CCDs, CIDs, FETs, charge wells, etc. Therefore, the following embodiments are intended to be exemplary implementations while the present invention is not limited to the particular circuit implementations shown.

Figure 12A:
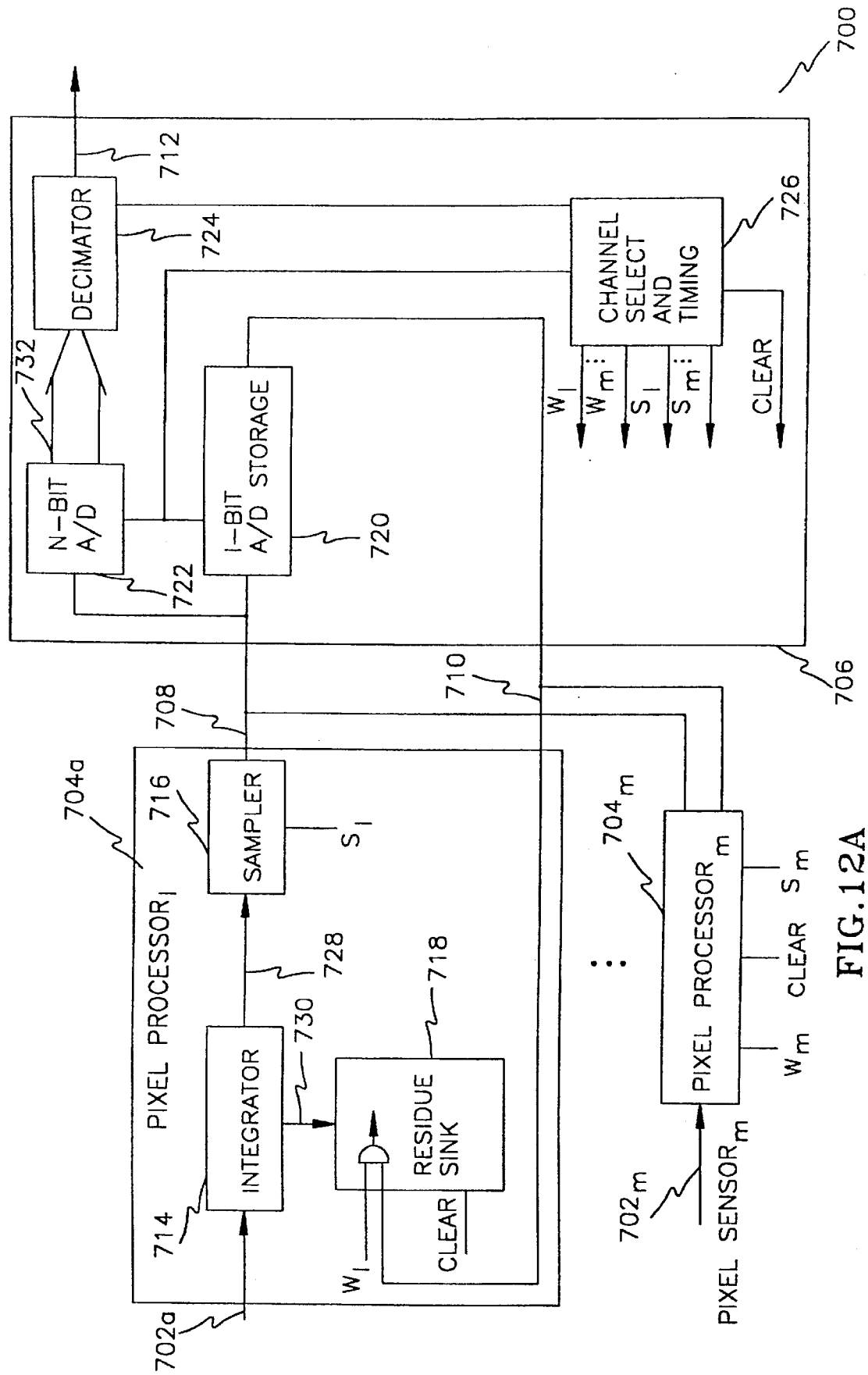
FIG. 12A is a block diagram of an optical imager embodiment implemented using a delta-sigma modulator of the present invention.

FIG. 12A shows a block diagram of a preferred embodiment of a delta-sigma modulator being used as an optical imager 700 comprised of a plurality of energy collection elements (not shown) each generating pixel sensor signals 702, a plurality of pixel sensor processors 704 for processing each pixel sensor signal 702 corresponding to each discrete energy collection element, and a common block of conversion logic 706 for sequentially processing signals from each pixel processor 704. The energy collection elements are formed as an array, e.g., arranged orthogonally, to generate the pixel sensor signals 702a–702m corresponding to an energy pattern incident on a focal plane.

In the imager embodiment 700, a discrete pixel processor, e.g., 704a, is associated with each energy collection element and receives an associated pixel sensor signal, e.g., 702a. Each pixel processor 704 time shares the common block of conversion logic 706 to form a plurality of delta-sigma modulators, as previously described, each having a single integration loop. By forming the integration loops in this time-shared manner, each pixel processor 704 can be mounted proximate to the energy collection elements, e.g., as a single chip or a hybrid, and thus minimizing the cost and size of the imager 700.

A common sampling bus 708 periodically receives sampled signals from each of the pixel processors 704 and, after processing by the conversion logic 706, returns a 1-bit digital signal on a common converter signal bus 710. Additionally, the conversion logic 706 generates a binary output bit stream 712 representative of the incident energy pattern. As previously described, the resolution of each sample, i.e., the number of bits associated with each pixel sensor signal 702, is a function of the amount of oversampling, as determined by timing signals in the conversion logic 706.

Each pixel processor 704 is primarily comprised of an integrator 714, a sampler 716 and a residue sink 718. Each pixel processor 704 communicates via the common busses 708, 710 to the single block of conversion logic 706. The conversion logic 706 is primarily comprised of a 1-bit A/D storage element 720, an N-bit A/D converter 722, a decimator 724, and a channel select and timing element 726.

Figure 12B:
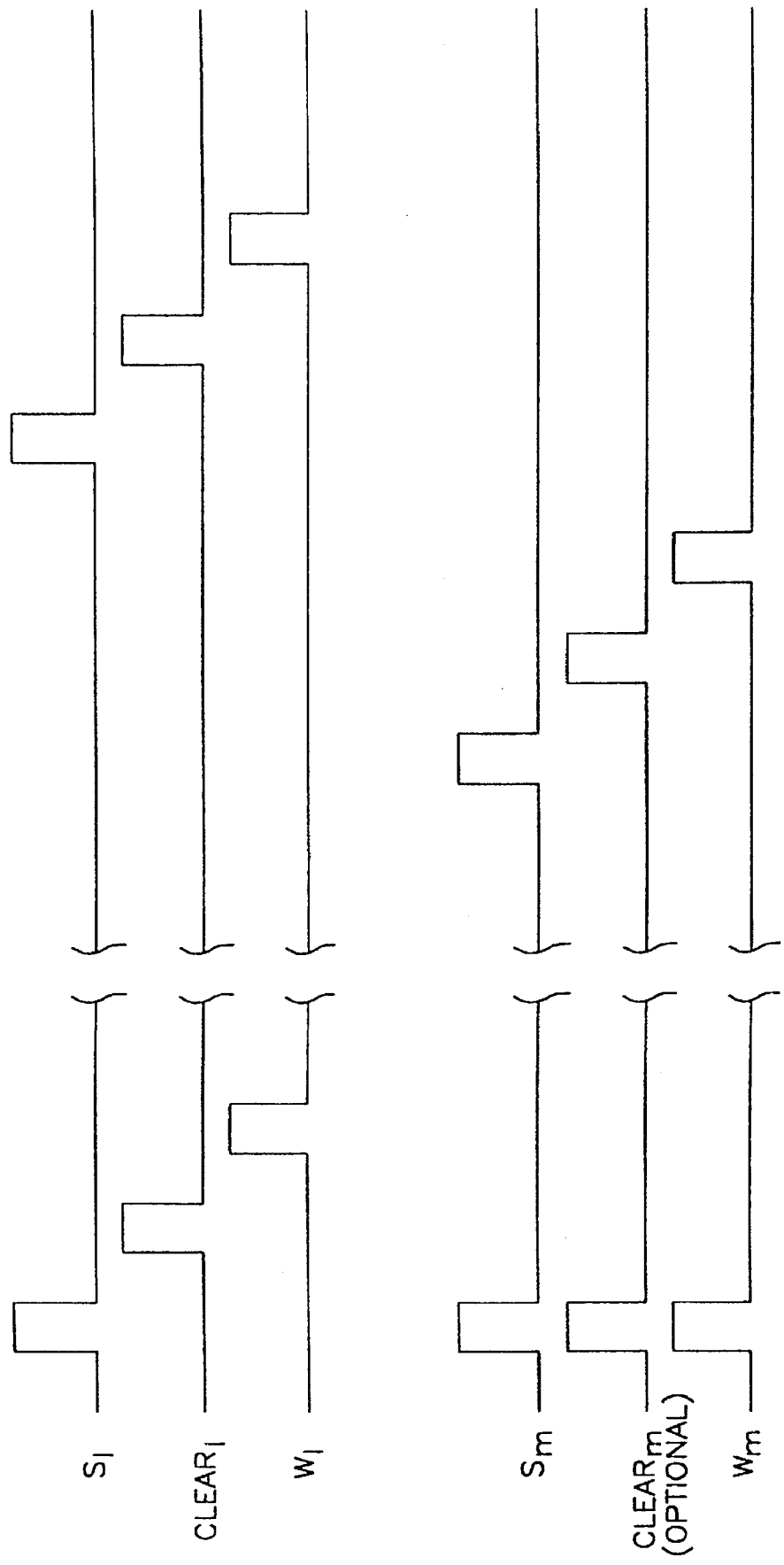
FIG. 12B is a timing diagram of the imager of FIG. 12A.

Periodically the received analog pixel sensor signal 702a is adjusted by the residue sink 718 (under control of write signal $W_1$ generated by the channel select and timing element 726 as shown in FIG. 12B) to generate a residue signal. This residue signal is continuously integrated by the integrator 714 to form an integrated residue signal 728. Under control of select signal $S_1$ (see FIG. 12B) generated by the channel select and timing element 726, the sampler 716 periodically passes the integrated residue signal 728, an analog signal, to the 1-bit A/D storage element 720 via the common sampling bus 708. Then, under control of the channel select and timing element 726, the 1-bit A/D storage element 720 compares the sampled integrated residue signal from the common sampling bus 708 to a predetermined threshold value and generates a single bit digital signal. This signal is then latched and presented on the common converter signal bus 710 to the residue sink 718. The residue sink 718 is periodically cleared to a known state by a clear signal (see FIG. 12B) generated from the channel select and timing element 726. Afterwards, whenever periodic write signal $W_1$ and the digital signal on the common converter signal bus 710 coincide (as represented by an AND gate in the residue sink 718) for a given pixel sensor signal 702, an amount of charge is removed via a residue sink path 730 by the residue sink 718 from the residue value being accumulated in the integrator 714.

Essentially contemporaneous with sampling by the 1-bit A/D storage element 720, the N-bit A/D converter 722 samples the analog signal on the common sampling bus 708. The N-bit A/D converter 722 then generates an N-bit digital output 732 that is presented to the decimator 724. After processing, the decimator 724 generates the binary output bit stream 712.

Under control of the channel select and timing element 726, the residue contained in each pixel processor, i.e., 704a–704m, is periodically sampled and updated according to the output of the 1-bit A/D storage element 720. Consequently, a plurality of integration loops, one for each of the pixel sensor signals 702a–702m, are formed using the shared block of conversion logic 706 with the resulting binary output bit stream 712 being representative of all of the pixel sensor signals, i.e., 702a–702m.

Element 720 has been referenced as a 1-bit A/D converter storage element. However, it should be recognized that a 1-bit A/D converter can also be described as a comparator and that the storage function can be performed with a flip flop or equivalent. Also, while FIG. 12A shows a common clear signal that clears all the residue sinks 718a–718m before each sampling cycle begins, separate clear signals can instead be provided to each residue sink 718, as shown in timing diagram FIG. 12B.

The equivalent bit resolution of the embodiment of FIG. 12A is dependent upon two factors: 1) the oversampling rate and 2) the resolution $N_2$ of the N-bit A/D converter 722. As is well known to one skilled in the art of delta-sigma modulators, oversampling with a 1-bit converter increases the equivalent resolution to $N_1$ bits. For example, using well known formulas, oversampling by a factor of sixteen generates six bits of resolution, i.e., $N_1=6$. The overall resolution of this delta-sigma modulator is the sum of the oversampling resolution plus the resolution of the N-bit A/D converter 722, i.e., $N_1+N_2$. For example, a 6-bit A/D converter used with an integration loop oversampled by a factor of sixteen, results in twelve bits of resolution. Therefore, a relatively high precision converter can be formed from relatively low precision components.

Figure 13:
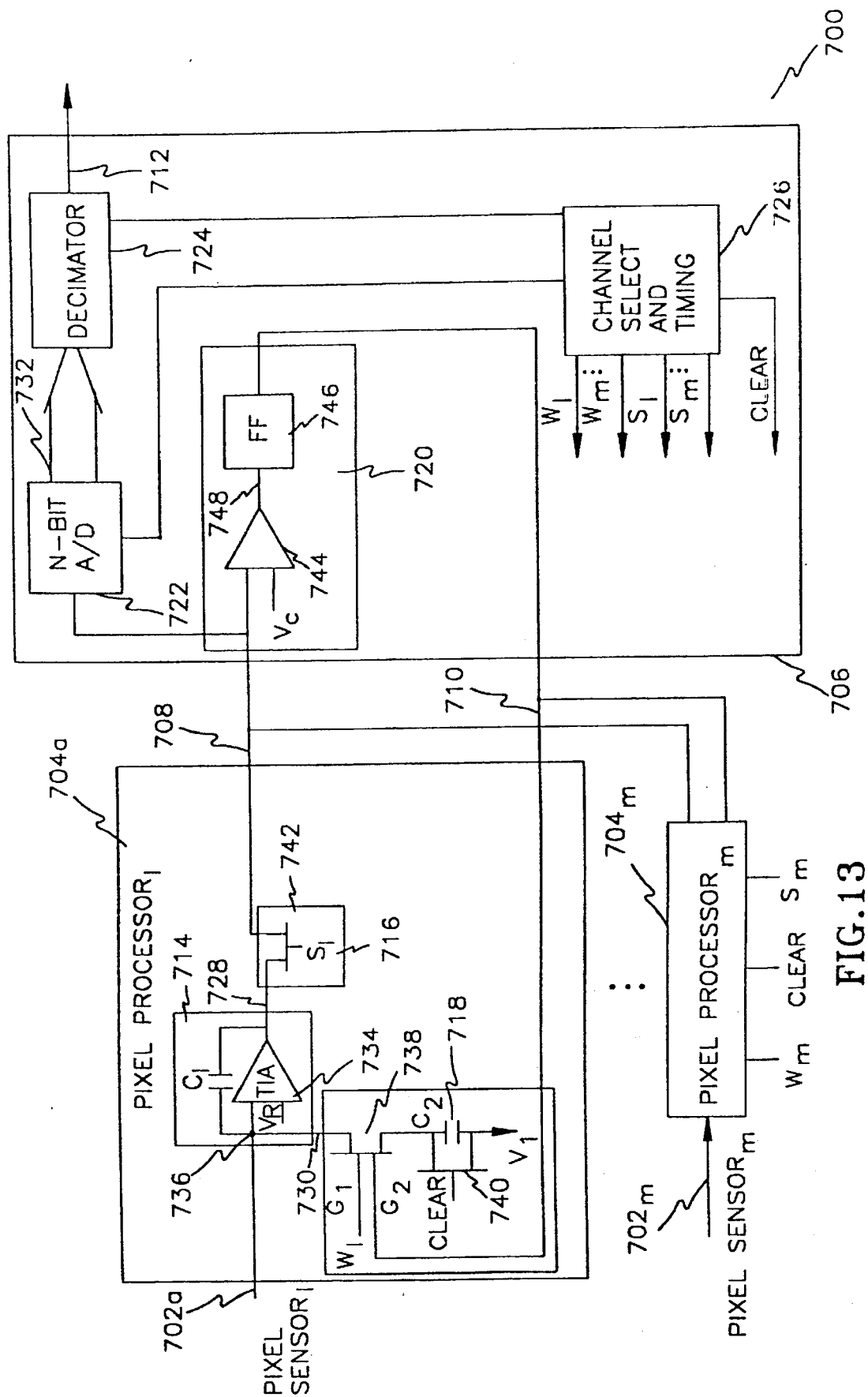
FIG. 13 is a schematic diagram of the imager of FIG. 12A using FET circuitry.

FIG. 13 shows an exemplary embodiment of the optical imager 700 of FIG. 12A using FET circuitry. In this figure, a schematic diagram is shown for the previously described elements, specifically the integrator 714, the residue sink 718, the sampler 716, and the 1-bit A/D storage element 720. Since one of ordinary skill in the art will recognize how this circuitry performs the previously defined functions, only a brief description will follow for each circuit block.

The integrator 714 is preferably formed of a trans-impedance amplifier 734 having integrating capacitor $C_1$ in its feedback loop. A reference voltage $V_R$ is chosen to provide a known bias to the signal source of the pixel sensor signal 702. A node 736 corresponding to a residue value is formed at the input to the trans-impedance amplifier 734 where the input from the pixel sensor signal 702, a first end of the integrating capacitor $C_1$, and the residue sink path 730 meet.

The residue sink 718 is comprised of a double gate FET 738, i.e., two FETs in series, which performs the previously described AND function, i.e., both gates, $G_1$ and $G_2$ must be enabled on to enable the residue sink 718. When the residue sink 718 is enabled, charge from the residue value node 736 flows into capacitor $C_2$ as regulated by the predetermined size of $C_2$ and the voltage $V_1$. As previously described, the residue sink 718 is periodically cleared under control of the clear signal. As shown in FIG. 13, this function is accomplished with a clear FET 740 which shunts the charge in capacitor $C_2$ when presented with the clear signal.

The sampler 716 is formed with a sampling FET 742. The sampling FET 742 passes the integrated residue signal 728 to the common sampling bus 708 from the trans-impedance amplifier 734 whenever the sampling signal, e.g., $S_1$, is enabled.

The 1-bit A/D storage element 720 is comprised of a comparator 744 and a flip flop 746. When the sampling signal $S_1$ is enabled, the signal on the common sampling bus 708, representative of the integrated residue signal 728, is compared to a threshold value $V_C$. This comparison results in a single bit digital signal 748 which is sampled by the flip flop 746 under control of the channel select and timing element 726. This sampled comparison result is thus stored in the flip flop 746 and the output of the flip flop 746 is output to the common converter signal bus 710.

Figure 14:
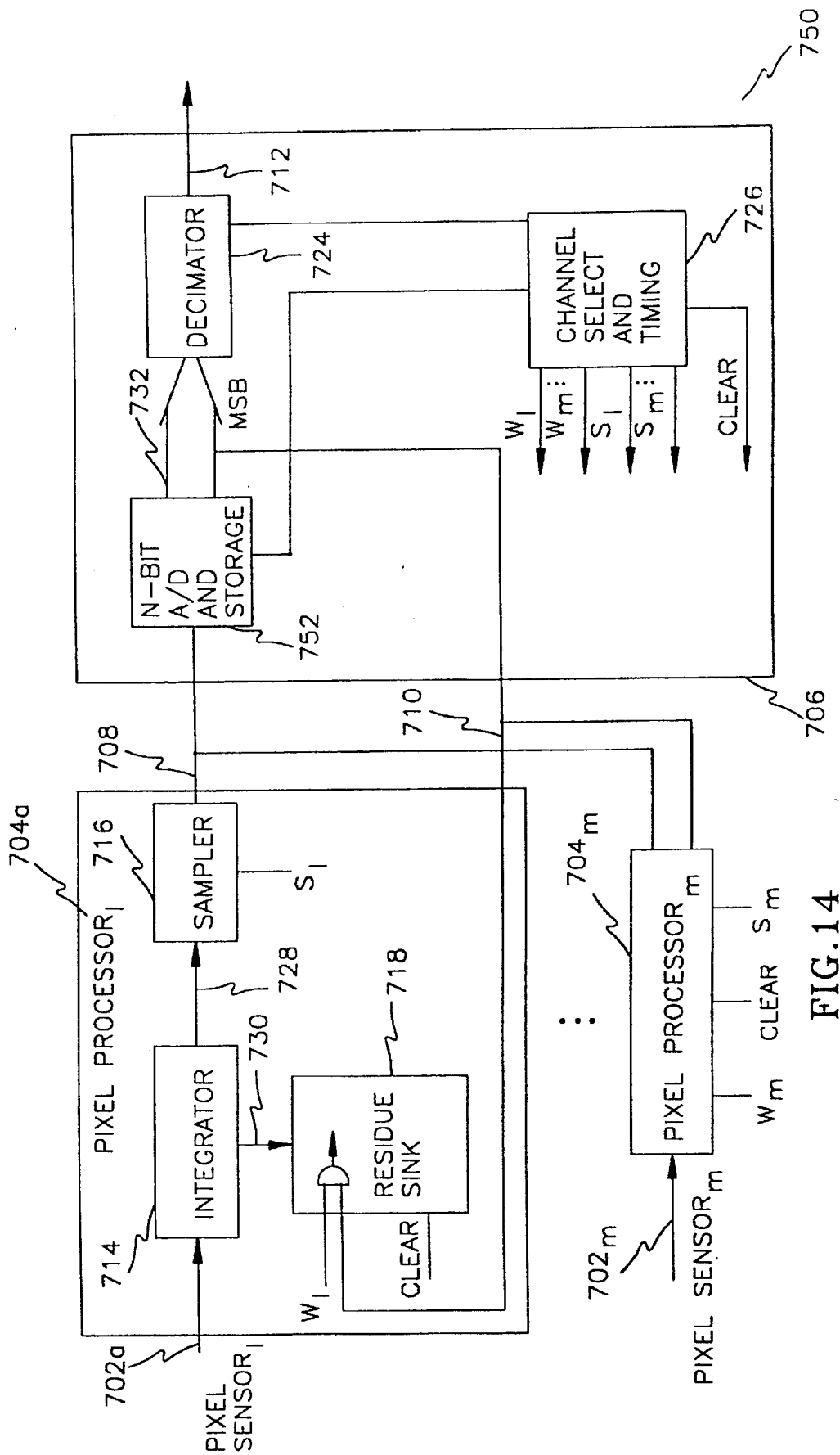
FIG. 14 is a block diagram of an alternative configuration of the optical imager embodiment of FIG. 12A.

FIG. 14 shows a block diagram of an alternative configuration of the optical imager previously shown in FIG. 12A. In an optical imager 750, the previously described functions of the 1-bit A/D storage element 720 and the N-bit A/D converter 722 are replaced with a single N-bit A/D storage element 752. In this configuration, the latched most significant bit (MSB) from the N-bit digital output 732 (alternatively latched by the N-bit A/D storage element 752 or a separate flip flop or equivalent) is used as the digital signal on the common converter signal bus 710. One of ordinary skill in the art should appreciate that the MSB output value from an N-bit A/D converter is essentially equivalent to the output of a comparator having a threshold value set to the middle of the signal range. In all other aspects, the performance and operation of the imager 750 are essentially equivalent to that of the imager 700.

Figure 15:
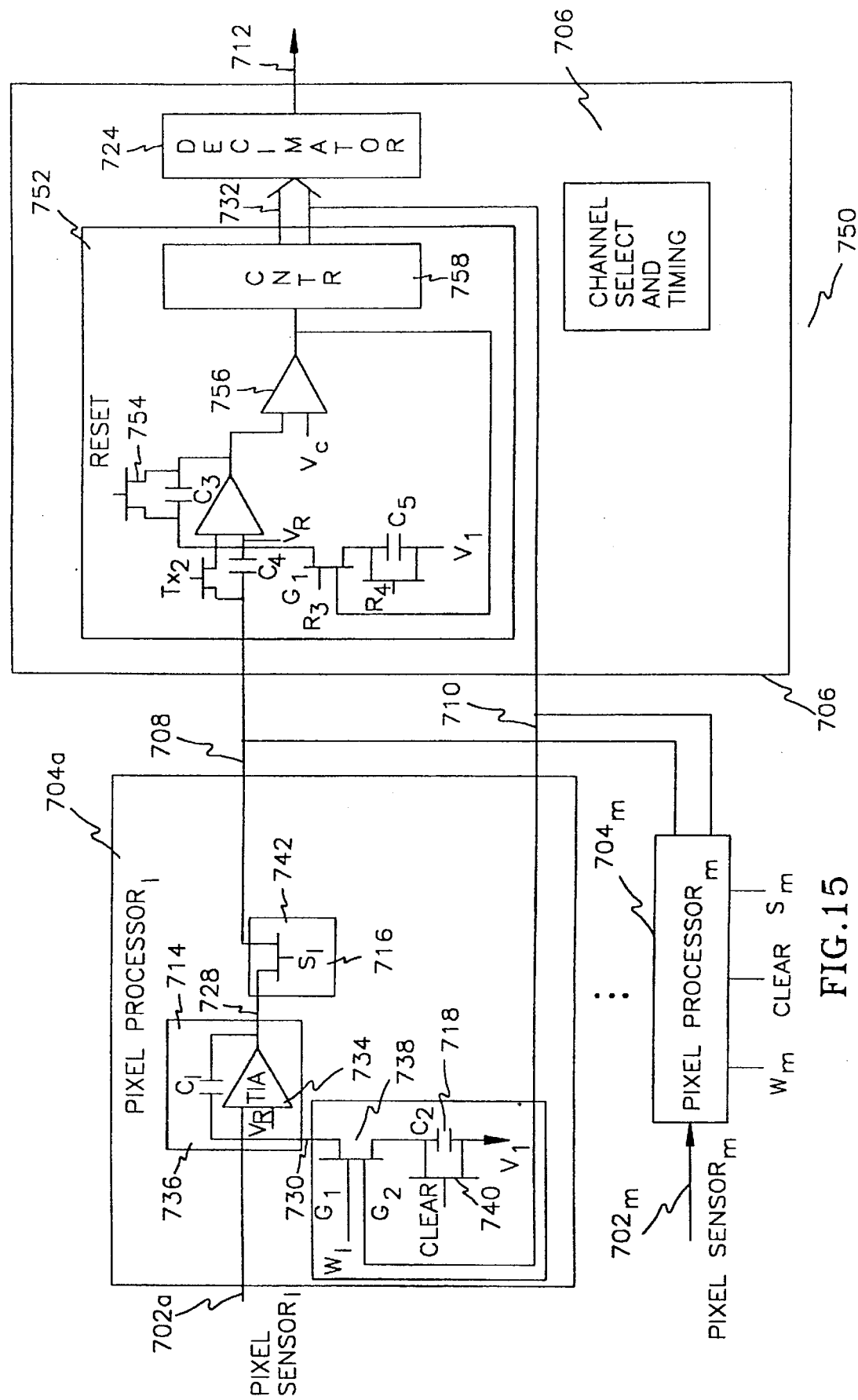
FIG. 15 is a schematic diagram of the imager of FIG. 14 using a counting A/D implemented with FET circuitry.

FIG. 15 is a schematic diagram of the optical imager of FIG. 14 using FET circuitry. The circuitry of FIG. 15 predominantly performs as the previously described circuitry shown in FIG. 13. The differences are directed to the implementation of the N-bit A/D storage element 752 as a counting A/D converter from FET circuitry similar to that shown forming each pixel processor 704. The major circuitry difference of the counting A/D converter 752 from the circuitry which forms the pixel processor 704 is the addition of a reset FET 754 across the integration capacitor $C_3$. The reset FET 754 is enabled at the beginning of each conversion cycle for the N-bit A/D storage element 752, i.e., the counting A/D converter. Counts are accumulated from a comparator 756 in counter 758 such that at the end of the conversion cycle an N-bit value has been accumulated in the counter 758. As previously discussed, the MSB of this N-bit value is output to the common converter signal bus 710 where it is periodically sampled by the associated residue sink 718. In other aspects, the operation of the counting A/D converter 752 should be familiar to one of ordinary skill in the art.

The resolution of the counting A/D converter 752 is dependent upon the number of counts, e.g., clock pulses, required for the counter 758 to reach a full-scale digital value corresponding to a full-scale analog input. For example, if sixty-four counts correspond to a full-scale value, then six bits of resolution are achieved ($2^N$=64, where N=6). Thus, multiple clocks or samples will exist within the counting A/D converter 752 following each adjustment of the pixel processor 704. Thus, in the schematic shown, sixty-four samples will be presented to the counting A/D 752, under control of $S_1$, following each adjustment of the residue using the residue sink 718. As previously described, the resolution of this delta-sigma converter is determined by the sum of this resolution, previously referenced as $N_2$, and the resolution resulting from oversampling, previously referenced as $N_1$.

Figure 16:
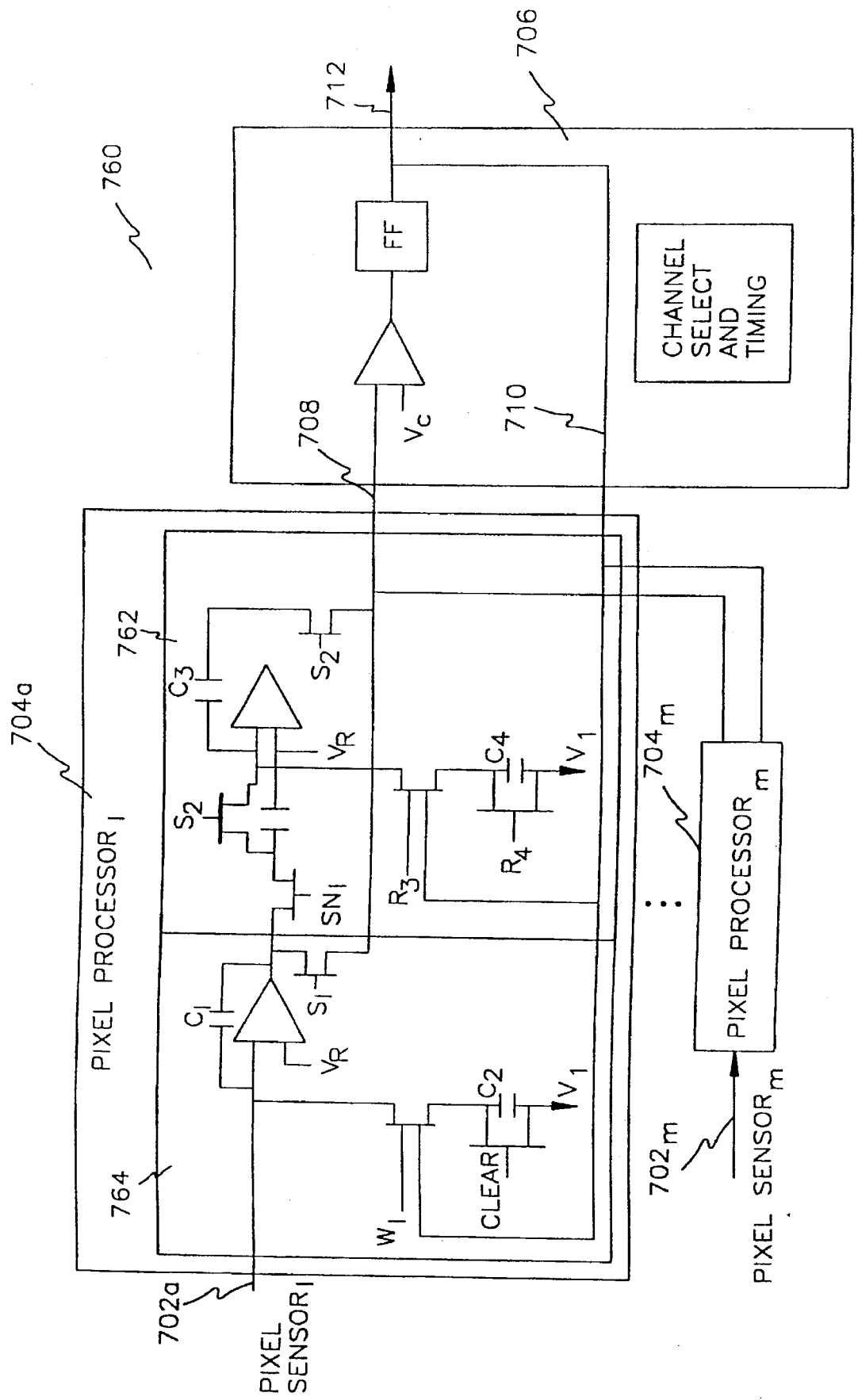
FIG. 16 is a schematic diagram of an alternative optical imager embodiment having a second integration loop using FET circuitry.

FIG. 16 is a schematic diagram of an alternative optical imager embodiment 760 having a second integration loop using FET circuitry. Specifically, in the case of delta-sigma modulators using a second intergration loop operating a selected oversampling rate, a higher precision digital value can be determined for each analog input.

Much of the embodiment shown in FIG. 16 closely resembles that already discussed in reference to FIG. 13. However, in this embodiment a second integration loop processor 762 has been added to operate on the output of a first integration loop processor 764, i.e., the pixel processor of FIG. 13. In this embodiment, both the first and second integration loop processors 764, 762 share the common block of conversion logic 706 via the common sampling bus 708 and the common converter signal bus 710 as previously described on a time-shared basis.

Figure 17:
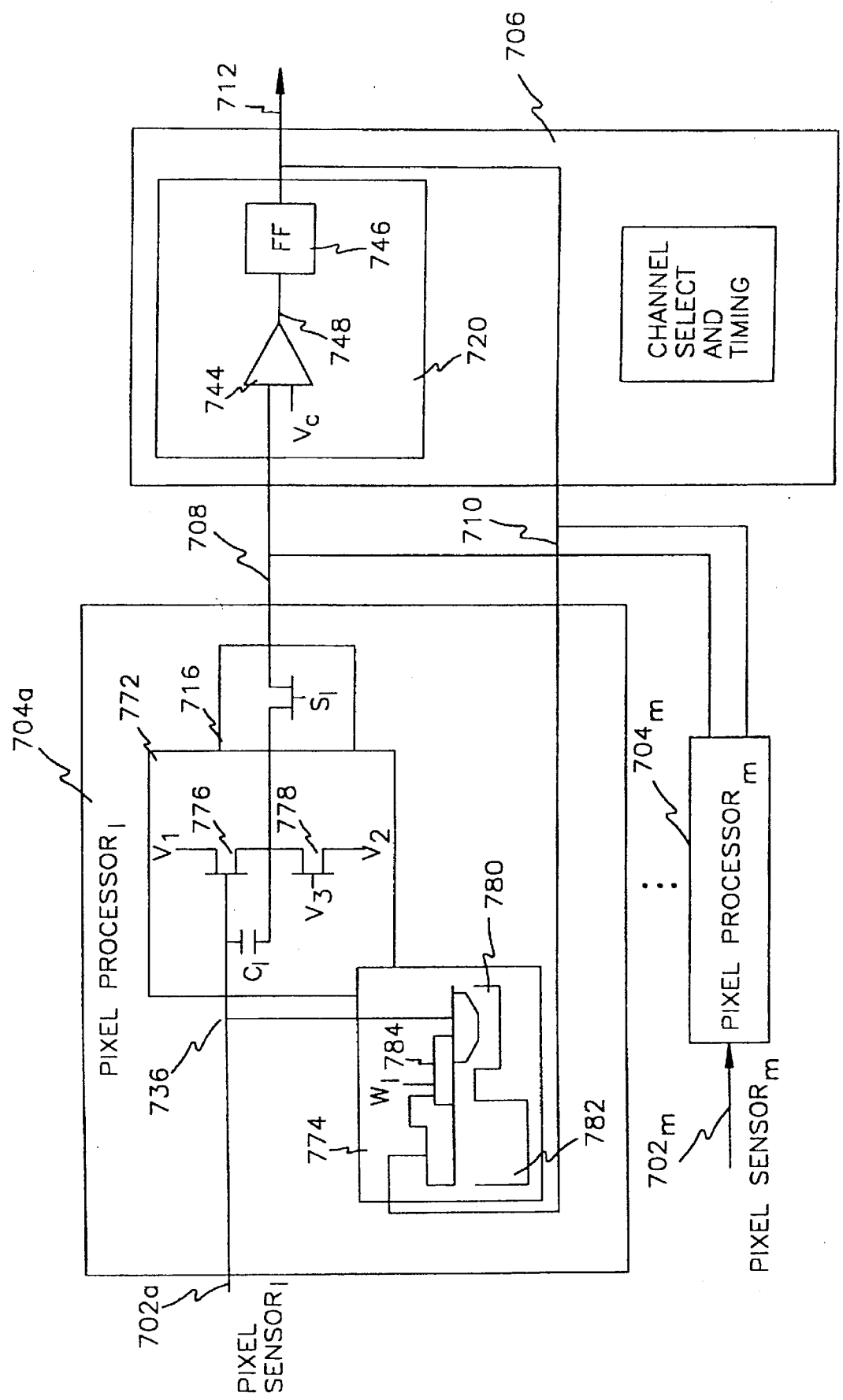
FIG. 17 is a schematic diagram of an optical imager embodiment comprised of an FET implemented transimpedance amplifier used as an integrator and a charge well implemented residue sink.

FIG. 17 shows an optical imager 770 comprised of an FET implemented trans-impedance amplifier used as an integrator 772 and a charge well implemented residue sink 774. In the imager 770, the integrator 772 is comprised of FETs 776, 778 and integration capacitor $C_1$ used in a feedback loop around FET 776. In operation, this FET implemented integrator 772 performs as previously described integrators 714.

In this implementation, charge wells are used to implement the residue sink 774. It has been determined that this implementation tends to minimize the amount of circuitry for each pixel processor 704. The charge well residue sink 774 transfers charge between charge wells 780, 782 when a write signal $W_1$ is periodically supplied to a transfer gate 784. The amount of charge transferred is dependent upon the size of the charge wells 780, 782. When the write signal $W_1$ is periodically supplied to the transfer gate 784, a fixed amount of charge received from the residue value node 736 flows through the charge well 780 to the charge well 782 according to the digital feedback value on the common converter signal bus 710. In this configuration, a clear signal, as described in the previously discussed embodiments, is not needed. Instead, the transferred charge is automatically dumped from the charge well 782 whenever the common signal bus 710 passes a zero value from the 1-bit A/D storage element 720. Thus, the channel select and timing element 726 is simplified in this implementation.

Figure 18:
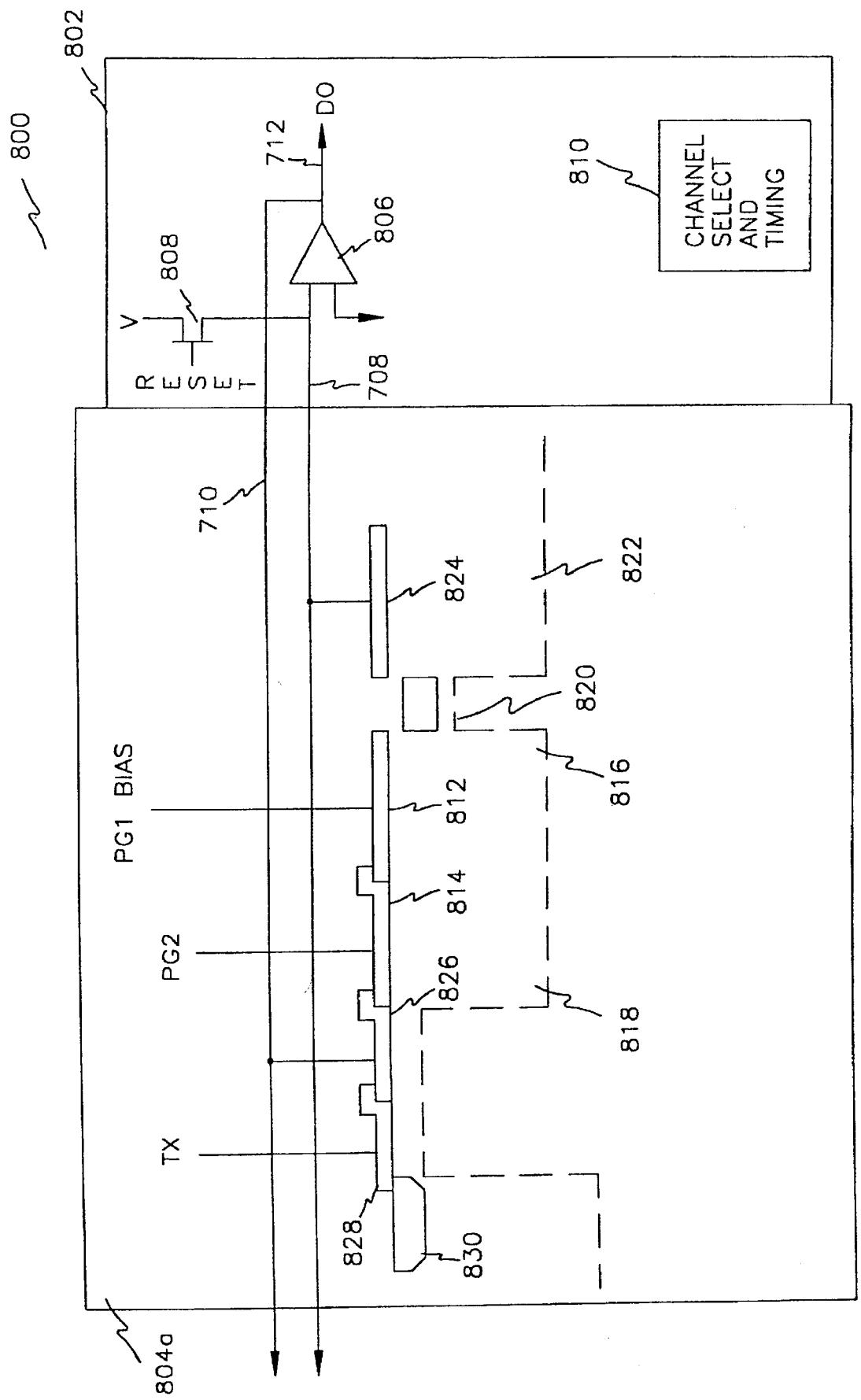
FIG. 18 shows a plurality of channels of an optical imager embodiment using a CID structure for multiplexing inputs from an array of photogates into a single binary bit stream.

FIG. 18 shows one of a plurality of channels of an optical imager 800 using a CID (charge injection device) structure adapted for multiplexing inputs from an array of photogates into a single binary bit stream. In this configuration, a common block of conversion logic 802 is shared with a plurality of CID implemented pixel processors 804 preferably formed as an orthogonal array on a single semiconductor chip. The conversion logic 802 is primarily comprised of a single common comparator 806, a reset FET 808 (whose function is described further below), and a channel select and timing element 810.

The pixel processor 804 is primarily comprised of a plurality of serially connected gates, having charge wells formed underneath, coupled to the conversion logic 802 via the common sampling bus 708 and the common converter signal bus 710. The functioning of each of these gates can best be understood when described in conjunction with Table I showing the timing signals generated by a channel select and timing element 810 for each of the pixel processors, e.g., 804a.

TABLE I

| Step | TX | D0 | PG2 | PG1 | Reset | Operation |
|---|---|---|---|---|---|---|
| 0 | 0 | 0 | 1 | 1 | 0 | Collecting photons in charge wells under PG1, PG2 |
| 1 | 0 | 0 | 0 | 1 | 0 | Charge shifted to the charge well under PG2, excess Transferred to the read well |
| 2 | 0 | 1 | 0 | 1 | 0 | Common comparator shows accumulated output if over a threshold value |

TABLE I-continued

| Step | TX | D0 | PG2 | PG1 | Reset | Operation |
|---|---|---|---|---|---|---|
| 3 | 1 | 1 | 0 | 1 | 0 | Charge dumping enabled |
| 4 | 1 | 1 | 1 | 1 | 0 | Charge from charge well under PG1 and PG2 are dumped |
| 5 | 0 | 1 | 1 | 1 | 0 | Charge dumping ends |
| 6 | 0 | 1 | 1 | 1 | 1 | Return residue charge in read well to PG1 well |
| | | | | | | Loop Back to Step 0 |
| 2A | 0 | 0 | 0 | 1 | 0 | Common comparator shows accumulated output if over a threshold value |
| 3A | 1 | 0 | 0 | 1 | 0 | |
| 4A | 1 | 0 | 1 | 1 | 0 | |
| 5A | 0 | 0 | 1 | 1 | 0 | |
| 6A | 0 | 1 | 1 | 1 | 1 | Return any charge in read well to PG1 well |
| | | | | | | Loop Back to Step 0 |

Initially at step 0, photogates 812, 814 collect photons in a charge well 816 under the photogate 812 and a charge well 818 under the photogate 814 while bias signal PG1 and control signal PG2 are enabled. After an accumulation period, PG2 is then disabled at step 1 forcing the charge accumulated from the charge well 818 to be transferred into the charge well 816. Excess charge will spill over a potential barrier 820 into a read well 822 under a gate 824. The gate 824 is coupled to the common sampling bus 708 which is input to the common comparator 806. The common comparator 806 compares the voltage, now on the common sampling bus 708, to a threshold value, e.g., a ground potential, and outputs a compared value D0 on the common converter signal bus 710. The common converter signal bus 710 is directly coupled to a first transfer gate 826. Additionally, the output of the common comparator 806, i.e., D0, forms the binary output bit stream 712 that is representative of the amount of energy received by each of the photogates 812, 814 sampled within the plurality of pixel processors 804. Depending on the amount of charge initially accumulated in the charge wells 816, 818, the conversion continues either at step 2 (accumulated charge over the threshold) or step 2A (accumulated charge below the threshold). When the accumulated charge does not exceed the threshold, processing continues with steps 2A–6A, permitting more time for charge from the collected photons to accumulate.

When the accumulated charge exceeds the threshold, generating signal D0, processing then continues with step 3 where a second transfer gate 828 is enabled with signal TX. Since TX and D0 are now enabled, charge can now be dumped from charge wells 816 and 818 to the substrate 830. This charge dumping starts at step 4 when the PG2 control signal enables dumping the charge from the charge well 816. The dumping of charge ends at step 5 when TX is disabled. Thus, a fixed amount of charge equal to the capacity of charge well 816 has been removed by the completion of step 5 when the accumulated residue exceeds the threshold value. Charge in the read well 822 is the residue that is returned to charge well 816 over the potential barrier 820 when the read well 822 is reset. However, should the threshold not be exceeded, as shown in steps 2A–5A, the charge is permitted to further accumulate since D0, the control signal to the first transfer gate 826, will be disabled.

In the final step, step 6, a reset signal is applied to the reset FET 808, to return the charge accumulated in each read well 822 to well 816 and to clear the common sampling bus 708.

The process then continues with step 0 for the next pixel processor, e.g., 804b. After each pixel processor, i.e., 804a–804m, and its associated photogates 812, 814 are sampled, the sampling process repeats. Consequently, output 712 is a binary bit stream representative of the energy being received by the array of photogates.

The teachings of the invention enable an all digital video camera/recorder to be manufactured with an improved image quality and at lower cost. The teachings permit all of the analog electronics conventionally used in video and sound detection to be replaced with a monolithic on focal plane imager having a binary output.

A preferred implementation can use CCD (charge coupled device) electronics to detect and digitally process images, sound and camera controls for virtually noise free recording and display. The binary output can be used to drive modulated flat panel displays directly or can be used with conventional filtering to interface raster scan analog displays. Other preferred embodiments can be effected in various integrated circuit technologies.

The preferred embodiments of the invention described herein are exemplary and numerous modifications and rearrangements can be readily envisioned to achieve an equivalent result, all of which are intended to be embraced within the scope of the appended claims.

I claim:

1. An imager responsive to an energy pattern incident on a focal plane for producing an output bit stream representative of said pattern, said imager comprising:

m energy collection elements, each capable of producing an analog pixel signal related to the amount of energy incident thereon, said m energy collection elements being mounted for respectively collecting energy from different areas of said focal plane;

m integrators each for integrating a different one of said pixel signals;

a common comparator for generating a one-bit comparison signal periodically related to each of said m integrated pixel signals and indicative of whether each of said integrated pixel signals exceed a predetermined threshold value;

timing circuitry for periodically sampling said one-bit comparison signal;

charge removal circuitry for periodically removing charge from each of said analog pixel signals according to the sample of said one-bit comparison signal related thereto;

a common N-bit A/D converter for periodically generating an N-bit value associated with each of said integrated pixel signals; and a decimator for processing a plurality of said N-bit values associated with each of said integrated pixel signals to generate said bit stream output.

2. The imager of claim 1, wherein each of said m integrators is mounted proximate to a different one of said m energy collection elements.

3. The imager of claim 1, wherein said energy collection elements comprise light sensitive elements arranged in a two-dimensional array substantially coincident with said focal plane.

4. The imager of claim 1, wherein said charge removal circuitry is comprised of FET transistors.

5. The imager of claim 1, wherein said charge removal circuitry is comprised of charge wells.

6. The imager of claim 1, wherein said integrators are comprised of FET transistors.

7. The imager of claim 1, wherein said integrators and said charge removal circuitry in combination with said common comparator form a first integration loop, said imager additionally comprising a second set of integrators and a second set of charge removal circuitry in combination with said common comparator forming a second integration loop.

8. An imager responsive to an energy pattern incident on a focal plane for producing an output bit stream representative of said pattern, said imager comprising:

m energy collection elements, each capable of producing an analog pixel signal related to the amount of energy incident thereon, said m energy collection elements being mounted for respectively collecting energy from different areas of said focal plane;

m integrators each for integrating a different one of said pixel signals;

timing circuitry for periodically sampling each of said m integrated pixel signals;

a common N-bit A/D converter for periodically generating and storing an N-bit value associated with the sample of each of said integrated pixel signals;

charge removal circuitry for periodically removing charge from each of said analog pixel signals according to the most significant bit of each said stored N-bit value related thereto; and a decimator for processing a plurality of said N-bit values associated with each of said integrated pixel signals to generate said bit stream output.

9. The imager of claim 8, wherein each of said m integrators is mounted proximate to a different one of said m energy collection elements.

10. The imager of claim 8, wherein said energy collection elements comprise light sensitive elements arranged in a two-dimensional array substantially coincident with said focal plane.

11. The imager of claim 8, wherein said charge removal circuitry is comprised of FET transistors.

12. The imager of claim 8, wherein said charge removal circuitry is comprised of charge wells.

13. The imager of claim 8, wherein said integrators are comprised of FET transistors.

14. The imager of claim 8, wherein said integrators and said charge removal circuitry in combination with said common N-bit A/D converter form a first integration loop, said imager additionally comprising a second set of integrators and a second set of charge removal circuitry in combination with said common N-bit A/D converter forming a second integration loop.

15. An imager responsive to an energy pattern incident on a focal plane for producing an output bit stream representative of said pattern, said imager comprising:

m energy collection elements, each capable of accumulating a charge related to the amount of energy incident thereon, said m energy collection elements being mounted for respectively collecting energy from different areas of said focal plane;

timing circuitry for periodically sampling on a common sampling bus said accumulated charges from each of said m energy collection elements;

a common comparator for generating a one-bit comparison signal, periodically related to the sample of each of said accumulated charges and indicative of whether each of said accumulated charges exceeds a predetermined threshold value; and charge removal circuitry for periodically removing said accumulated charge from each of said energy collection elements according to said common one-bit comparison signal;

wherein said output bit stream is comprised of said common one-bit comparison signal.

16. The imager of claim 15, additionally comprising an array of CID devices controlled by said timing circuitry.

17. The image of claim 15, wherein said charge removal circuitry is comprised of charge well devices.

18. An imager responsive to an energy pattern incident on a focal plane for producing an output bit stream representative of said pattern, said imager comprising:

m energy collection elements, each capable of producing an analog pixel signal related to the amount of energy incident thereon, said m energy collection elements being mounted for respectively collecting energy from different areas of said focal plane;

m integrators each for integrating a different one of said pixel signals;

common comparison circuitry for generating a one-bit comparison signal periodically related to each of said m integrated pixel signals and indicative of whether each of said integrated pixel signals exceed a predetermined threshold value;

timing circuitry for periodically sampling said one-bit comparison signal;

charge removal circuitry for periodically removing charge from each of said analog pixel signals according to the sample of said one-bit comparison signal related thereto; and decimator circuitry for processing digital signals periodically related to each of said m integrated pixel signals to generate said bit stream output.

19. A method for producing a bit stream output representative of an energy pattern incident on a focal plane, comprising the steps of:

providing an array of m energy collection elements, each capable of producing an analog pixel signal related to the amount of energy incident thereon;

mounting each of said m energy collection elements for collecting energy from a different area of said focal plane;

integrating each of said analog pixel signals;

periodically sampling each of said m integrated pixel signals with common circuitry to generate a one-bit comparison signal indicative of whether each of said integrated pixel signals exceed a predetermined threshold value;

periodically removing charge from each of said analog pixel signals according to a periodic sample of said one-bit comparison signal related thereto; and processing digital signals periodically related to each of said m integrated pixel signals with common circuitry to generate said bit stream output.

20. An apparatus for producing an output bit stream representative of an array of analog signals, said apparatus comprising:

m integrators each for integrating a different one of said analog signals;

a common comparator for generating a one-bit comparison signal periodically related to each of said m integrated signals and indicative of whether each of said integrated signals exceed a predetermined threshold value;

timing circuitry for periodically sampling said one-bit comparison signal;

charge removal circuitry for periodically removing charge from each of said analog signals according to the sample of said one-bit comparison signal related thereto;

a common N-bit A/D converter for periodically generating an N-bit value associated with each of said integrated signals; and a decimator for processing a plurality of said N-bit values associated with each of said integrated signals to generate said bit stream output.

21. An apparatus for producing an output bit stream representative of an array of analog signals, said apparatus comprising:

m integrators each for integrating a different one of said analog signals;

timing circuitry for periodically sampling each of said m integrated signals;

a common N-bit A/D converter for periodically generating and storing an N-bit value associated with the sample of each of said integrated signals;

charge removal circuitry for periodically removing charge from each of said analog signals according to the most significant bit of each said stored N-bit value related thereto; and a decimator for processing a plurality of said N-bit values associated with each of said integrated signals to generate said bit stream output.

22. An apparatus for producing an output bit stream representative of an array of analog signals, said apparatus comprising:

timing circuitry for periodically sampling on a common sampling bus said accumulated charges from each of said m analog signals;

a common comparator for generating a one-bit comparison signal, periodically related to the sample of each of said accumulated charges and indicative of whether each of said accumulated charges exceeds a predetermined threshold value; and charge removal circuitry for periodically removing said accumulated charge from each of said energy collection elements according to said common one-bit comparison signal;

wherein said output bit stream is comprised of said common one-bit comparison signal.

23. A apparatus for producing an output bit stream representative of an array of analog signals, said apparatus comprising:

m integrators each for integrating a different one of said analog signals;

common comparison circuitry for generating a one-bit comparison signal periodically related to each of said m integrated signals and indicative of whether each of said integrated pixel signals exceed a predetermined threshold value;

timing circuitry for periodically sampling said one-bit comparison signal;

charge removal circuitry for periodically removing charge from each of said analog pixel signals according to the sample of said one-bit comparison signal related thereto; and decimator circuitry for processing digital signals periodically related to each of said m integrated signals to generate said bit stream output.

24. A method for producing a bit stream output representative of an array of analog signals, comprising the steps of:

integrating each of said analog signals;

periodically sampling each of said m integrated signals with common circuitry to generate a one-bit comparison signal indicative of whether each of said integrated signals exceed a predetermined threshold value;

periodically removing charge from each of said analog signals according to a periodic sample of said one-bit comparison signal related thereto; and processing digital signals periodically related to each of said m integrated signals with common circuitry to generate said bit stream output.

* * * * *